United States Patent
Kale et al.

(10) Patent No.: US 6,594,808 B1
(45) Date of Patent: Jul. 15, 2003

(54) STRUCTURAL REGULARITY EXTRACTION AND FLOORPLANNING IN DATAPATH CIRCUITS USING VECTORS

(75) Inventors: Sudhakar Kale, San Jose, CA (US); Amit Chowdhary, Sunnyvale, CA (US); Phani Saripella, Santa Clara, CA (US); Naresh K. Sehgal, Santa Clara, CA (US); Rajesh Gupta, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/435,112

(22) Filed: Nov. 5, 1999

Related U.S. Application Data

(63) Continuation-in-part of application No. 09/187,543, filed on Nov. 6, 1998, now Pat. No. 6,148,433.

(51) Int. Cl.$^7$ .............................................. G06F 17/50
(52) U.S. Cl. .................................. 716/8; 716/2; 716/3
(58) Field of Search ................................ 716/1, 7, 8, 2, 716/3, 4, 18

(56) References Cited

U.S. PATENT DOCUMENTS

| | | | | |
|---|---|---|---|---|
| 5,652,874 A | * | 7/1997 | Upson et al. .................. | 716/11 |
| 5,737,237 A | | 4/1998 | Tanaka et al. ............... | 364/491 |
| 5,838,583 A | | 11/1998 | Varadarajan et al. ........ | 364/491 |
| 5,898,595 A | | 4/1999 | Bair et al. ................... | 364/491 |
| 5,910,898 A | | 6/1999 | Johannsen ................... | 364/489 |
| 5,926,398 A | | 7/1999 | Nakamura ................... | 364/491 |
| 5,930,499 A | | 7/1999 | Chen et al. ............. | 395/500.09 |
| 5,991,524 A | | 11/1999 | Belkhale et al. ........ | 395/500.19 |
| 6,066,178 A | * | 5/2000 | Bair ............................. | 716/1 |
| 6,148,433 A | * | 11/2000 | Chowdhary et al. .......... | 716/1 |
| 6,189,131 B1 | * | 2/2001 | Graef et al. ................... | 716/8 |
| 6,230,303 B1 | * | 5/2001 | Dave ............................. | 716/7 |
| 6,237,129 B1 | * | 5/2001 | Patterson et al. .............. | 716/8 |

OTHER PUBLICATIONS

Chowdhary, A., et al., "Extraction of Functional Regularity in Datapath Circuits", *IEEE Transactions on Computer–Aided Design of Integrated Circuits and Systems*, vol. 18, 1279–1296, (Sep. 1999).

Rao, D., et al., "An Approach to Scheduling and Allocation Using Regularity Extraction", *IEEE*, 557–531, (1993).

Chowdhary, Amit., et al., "Extraction of Functional Regularity in Datapath Circuits", *IEEE Transactions on Computer–Aided Design of Integrated Circuits and Systems*, vol. 18, No. 9, Sep. 1999, XP–002191876, 1279–1296.

(List continued on next page.)

*Primary Examiner*—Leigh M. Garbowski
(74) *Attorney, Agent, or Firm*—Schwegman, Lundberg, Woessner & Kluth, P.A.

(57) ABSTRACT

In some embodiments, a computer-aided design system comprises a functional regularity extraction component, a structural regularity extraction component and a floorplanning component. The functional regularity extraction component provides a method to extract regularity for circuits (and in particular datapath circuits) based on the functional characteristics of a logic design. Some embodiments of the functional regularity extraction component automatically generate a set of templates to cover a circuit. A template is a representation of a subcircuit with at least two instances in the circuit. The templates generated by the functional regularity extraction component are used by a structural regularity extraction component. The structural regularity extraction component provides a method to extract regularity for circuits (and in particular datapath circuits) based on the structural characteristics of a logic design. Some embodiments of the structural regularity extraction component automatically generate a set of vectors for the logic design. A vector is a group of template instances that are identical in function and in structure. The vectors generated by the structural regularity extraction component are used by a floorplanning component. The floorplanning component provides a method of generating a circuit layout from the set of vectors. In some embodiments, each vectors corresponds to a row in the circuit layout.

10 Claims, 28 Drawing Sheets

OTHER PUBLICATIONS

Arikati, S.R., et al., "A Signature Based Approach to Regularity Extraction", *Proceedings IEEE International Conference on CAD*, 542–545, (Nov. 1997).

Chowdhary, A., et al., "A General Approach for Regularity Extraction in Datapath Circuits", *ICCAD*, (Nov. 1998).

Chowdhary, A., et al., "Technology Mapping for Field–Programmable Gate Arrays Using Integer Programming", *Proceedings IEEE International Conference on CAD*, 346–352, (Nov. 1995).

Corazao, M.R., et al., "Performance Optimization Using Template Mapping for Datapath–Intensive High–Level Synthesis", *IEEE Transactions on Computer–Aided Design of Integrated Circuits and Systems, vol. 15, 8*, 877–888, (Aug. 1996).

Detjens, E., et al., "Technology Mapping in MIS", *Proceedings IEEE International Conference on CAD*, 116–119, (1987).

Dobberpuhl, D.W., "Circuits and Technology for Digital's StrongARM and Alpha Microprocessors", *Proceedings Seventeenth Conference on Advanced Research in VLSI*, 2–11, (Sep. 15–16 1997).

Gupta, R.K., et al., "Using a Programming Language for Digital System Design", *IEEE Design & Test of Computers*, 72–80, (Apr. 1997).

Hansen, M.C., et al., "High–Level Test Generation using Physically–Induced Faults", *13th IEEE VLSI Test Symposium*, 20–28, (May 1995).

Hirsch, M., et al., "Automatically Extracting Structure from a Logical Design", *Proceedings IEEE International Conference on CAD*, 456–459, (Nov. 1988).

Keutzer, K., "DAGON: Technology Binding and Local Optimization by DAG Matching", *Proceedings 24th Design Automation Conference*, 341–347, (Jun. 1987).

Li, J., et al., "HDL Code Restructuring Using Timed Decision Tables", *Proceedings of the Sixth International Workshop on Hardware/Software Codesign*, 131–135, (Mar. 1998).

Nijssen, R., et al., "GreyHound: A Methodology for Utilizing Datapath Regularity in Standard Design Flows", *Integration, the VLSI Journal 25*, 111–135, (1998).

Nijssen, R., et al., "Regular Layout Generation of Logically Optimized Datapaths", *Proceedings International Symposium on Physical Design*, 42–47, (1997).

Odawara, G., et al., "Partitioning and Placement Technique for CMOS Gate Arrays", *IEEE Transactions on Computer–Aided Design, vol. CAD–6, 3*, 355–363, (May 1987).

Rabaey, J.M., et al., "Fast Prototyping of Datapath–Intensive Architectures", *IEEE Design & Test of Computers*, 40–51, (Jun. 1991).

Rao, D.S., et al., "On Clustering for Maximal Regularity Extraction", *IEEE Transactions on Computer–Aided Design of Integrated Circuts and Systems, vol. 12, 8*, 1198–1208, (Aug. 1993).

Yalcin, H., et al., "An Approximate Timing Analysis Method for Datapath Circuits", *Proceedings IEEE International Conference on CAD*, 114–118, (Nov. 1996).

\* cited by examiner

STRUCTURAL REGULARITY EXTRACTION AND FLOORPLANNING IN DATAPATH CIRCUITS USING VECTORS

This application is a Continuation-In-Part of U.S. application Ser. No. 09/187,543 filed Nov. 6, 1998, now U.S. Pat. No. 6,148,433 issued Nov. 14, 2000.

BACKGROUND OF THE INVENTION

1. Technical Field of the Invention

The present invention relates to computer-aided design (CAD) and, more particularly, to regularity extraction in the design of integrated circuits.

2. Background Art

In high-performance custom integrated circuit designs, designers take advantage of the high degree of regularity often present in circuits to generate efficient layouts in terms of area and performance as well as to reduce the design effort. Datapath circuits perform various arithmetic and multiplexing operations on wide buses. Such circuits have a very high degree of regularity. The design effort can be reduced by identifying or extracting regularity in circuits, thus improving the productivity of designers. Currently, however, datapath circuits in general-purpose microprocessors are designed almost entirely by hand. Existing CAD tools can not extract and utilize regularity to the extent necessary for competitive designs.

Various techniques for extraction of functional regularity have been proposed in the literature. For example, D. S. Rao et al., "On clustering for maximal regularity extraction," IEEE Trans. on CAD of Integrated Circuits and Systems, Vol. 12, No. 8 (August. 1993), pp. 1198–1208, describes a string matching algorithm to find all instances of user-specified templates in the circuit, and then heuristically choose a subset of the set of templates to cover the circuit. The final cover is sensitive to the templates provided by the designer. M. R. Corazao et al., "Performance optimization using template mapping for datapath-intensive high-level synthesis," IEEE Trans. on CAD of Integrated Circuits and Systems, Vol. 15, No. 8 (August 1996), pp. 877–887, also assumes that a template library is provided, but claims to generate all complete as well as partial instances of a given template in the circuit. Another approach described in R. X. T. Nijssen et. al., "Regular layout generation of logically optimized datapaths," Proc. Int'l Symp. on Physical Design, (1997), pp. 42–47, involves choosing small logic components, such as latches, as templates, and then growing them to obtain bigger templates. This approach is highly dependent on the initial choice of templates.

Various techniques for extraction of structural regularity have also been proposed in the literature. For example, G. Odawara et al., "Partitioning and Placement Technique for CMOS Gate Arrays," IEEE Trans. on CAD, Vol. 6, No. 3 (May 1987), pp. 355–363, presents a methodology to identify structural regularity in highly-regular datapaths. Odawara's method chooses latches driven by the same control signals as initial templates, and uses them to grow larger templates. Odawara's approach identifies one-dimensional regularity in terms of bit-slices of the datapath. Other approaches by R. X. T. Nijssen et al, "Regular Layout Generation of Logically Optimized Datapaths," Proc. Int's Symp. on Physical Design, (1997) pp. 42–47, and S. R. Arikati et al., "A Signature Based Approach to Regularity Extraction," Proc. Int'l Conf. on CAD, (Nov. 1997), pp. 542–545, extend Odawara's methodology to identify bit slices as well as stages of datapath circuits. However, these structural methods are not sufficient for circuits with a mix of datapath and control logic.

In the approaches in the above-listed articles opportunities for regularity extraction are missed. Furthermore, there is a need for a regularity extraction approach which would speed up technology mapping and layout generation of datapath circuits without comprising the final design quality.

Accordingly, there is a need for techniques for systematic regularity extraction.

SUMMARY

In some embodiments, the invention includes a computerized method for identifying structural regularity in a logic design. The method includes receiving a plurality of templates covering the logic design, receiving one or more control signals for the logic design, and receiving one or more databus identifiers for the logic design. The method generates a first vector for the logic design through computer automated operations to combine at least one instance of one of the plurality of templates based on the control signals, the databus identifiers and connectivity of the logic design.

BRIEF DESCRIPTION OF THE DRAWINGS

The invention will be understood more fully from the detailed description given below and from the accompanying drawings of embodiments of the invention which, however, should not be taken to limit the invention to the specific embodiments described, but are for explanation and understanding only.

DETAILED DESCRIPTION

In the following detailed description of the preferred embodiments, reference is made to the accompanying drawings which form a part hereof, and in which is shown by way of illustration specific embodiments in which the invention may be practiced. It is to be understood that other embodiments may be utilized and. structural changes may be made without departing from the scope of the present invention.

The phrase "some embodiments" refers to at least some embodiments of the invention. The various appearances of "some embodiments" are not necessarily referring to the same embodiments. If the specification states a component, feature, structure, or characteristic "may", "might", or "could" be included, that particular component, feature, structure, or characteristic is not required to be included. Reference in the specification to "an embodiment" or "one embodiment" means that a particular feature, structure, or characteristic described in connection with the embodiment is included in at least some embodiments, but not necessarily all embodiments, of the invention.

A. System Level Overview

Figure 1:
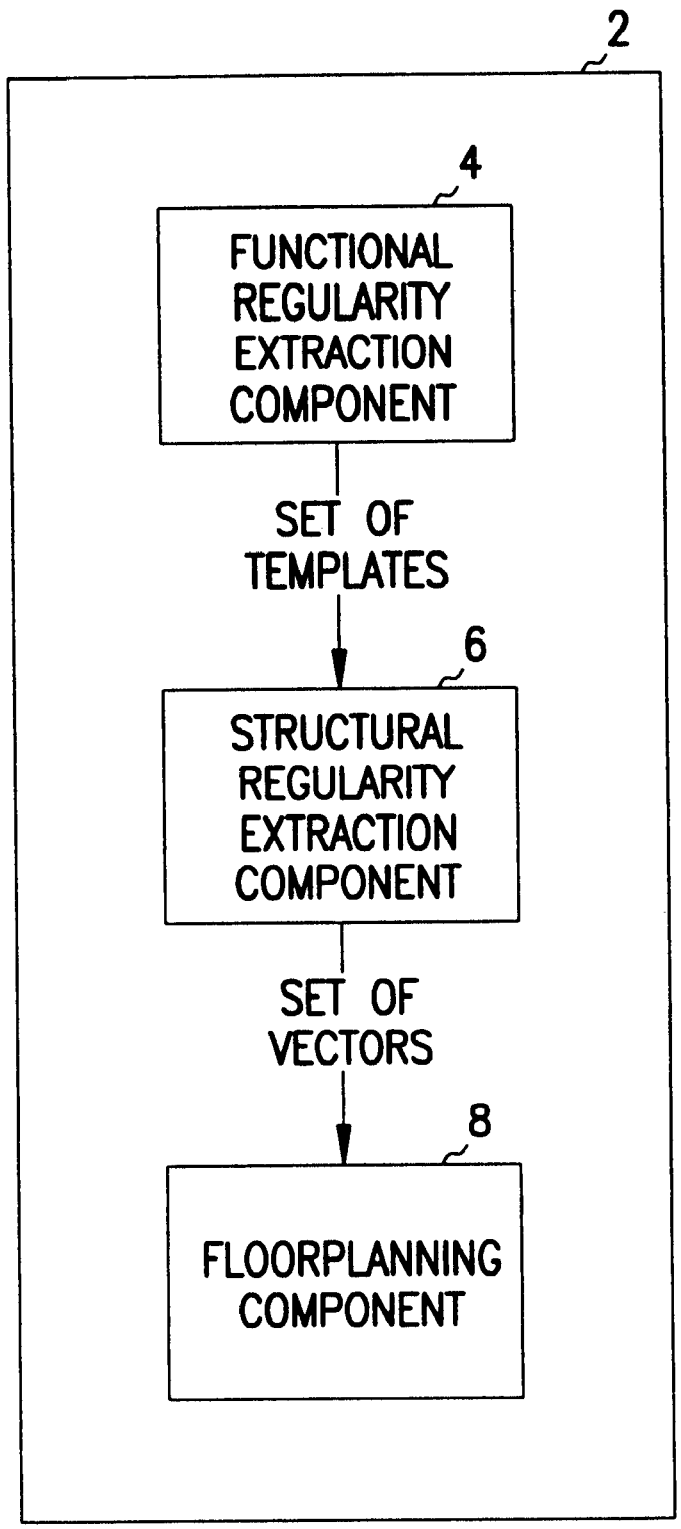
FIG. 1 is a block diagram of a computer-aided design system according to one embodiment of the present invention.

A system level overview of the operation of an example embodiment of the invention is described by reference to FIG. 1. The computer-aided design system 2, as shown in FIG. 1, comprises a functional regularity extraction component 4, a structural regularity extraction component 6 and a floorplanning component 8.

The functional regularity extraction component 4 provides a method to extract regularity for circuits (and in particular datapath circuits) based on the functional characteristics (i.e. logic functions) of a logic design. Some embodiments of the functional regularity extraction component 4 automatically generate a set of templates to cover a circuit. A template is a representation of a subcircuit with at least two instances in the circuit. The functional regularity extraction component 4 is described in detail in section B of the detailed description. The templates generated by the functional regularity extraction component 4 are used by the structural regularity extraction component 6.

The structural regularity extraction component 6 provides a method to extract regularity for circuits (and in particular datapath circuits) based on the structural characteristics of a logic design. Some embodiments of the structural regularity extraction component 6 automatically generate a set of vectors for the logic design. A vector is a group of template instances that are identical in function and in structure. The structural regularity extraction component 4 is described in detail in section C of the detailed description. The vectors generated by the structural regularity extraction component 6 are used by the floorplanning component 8.

The floorplanning component 8 provides a method of generating a floorplan for the logic design using the vectors. The floorplanning component 8 generates a one-dimensional circuit layout using the vectors generated by the structural regularity extraction component 6. Each vector forms a row in the circuit layout for the logic design.

B. Functional Regularity Extraction

B1. Overview

The invention includes a general approach to extract functional regularity for circuits (and in particular datapath circuits) from high level behavioral or structural descriptions, such as hardware descriptor language (HDL) descriptions. Verilog or VHDL are well know examples of HDL. Embodiments of the invention involve automatically generating a set of templates, where a template is a representation of a subcircuit with at least two instances in the circuit. In that a circuit may be represented as a graph, a subcircuit may be called a subgraph. A subgraph may be an instance of a template. In some embodiments, the set of templates is the complete set of all possible templates under some simplifying assumptions. The set of templates may include more than one class of templates. For example, in some embodiments, one class of template is a tree template and another class is a special class of multi-output templates, called single-principal output (single-PO) templates, where all outputs of the template are in the transitive fanin of a particular output of the template. A tree could be viewed as a special case of a single-PO template, having only one output. Nevertheless, a tree template is considered to be a different class than a single-PO template. In some embodiments, different algorithms are used to generate tree and single-PO templates.

As is described below, a subset of this set of templates is chosen to cover the circuit. Unlike prior art techniques, a user does not have to specify the templates to be used. In some embodiments, however, a user may designate some templates.

The components of a circuit in the high level descriptions may be logic gates (such as AND, OR and multiplexers) or arithmetic operators (such as adders and shifters). The task of regularity extraction is to identify a set of templates, and cover the circuit by a subset of these templates, where the objective may be to use large templates with many instances. However, the regularity extraction often involves a tradeoff, since a large template usually has a fewer instances, while a small template may have many instances. Formulation of a good set of templates may allow tradeoffs among multiple criteria, such as area, timing and power, and allow a user to build multi-technology designs, such as using a combination of static and dynamic logic. Prior art techniques will miss many of these tradeoffs and produce suboptimal covers. There may be different templates with the same functional description where the high level language specifies a difference (e.g., the loading on a component in the templates).

Figure 2:
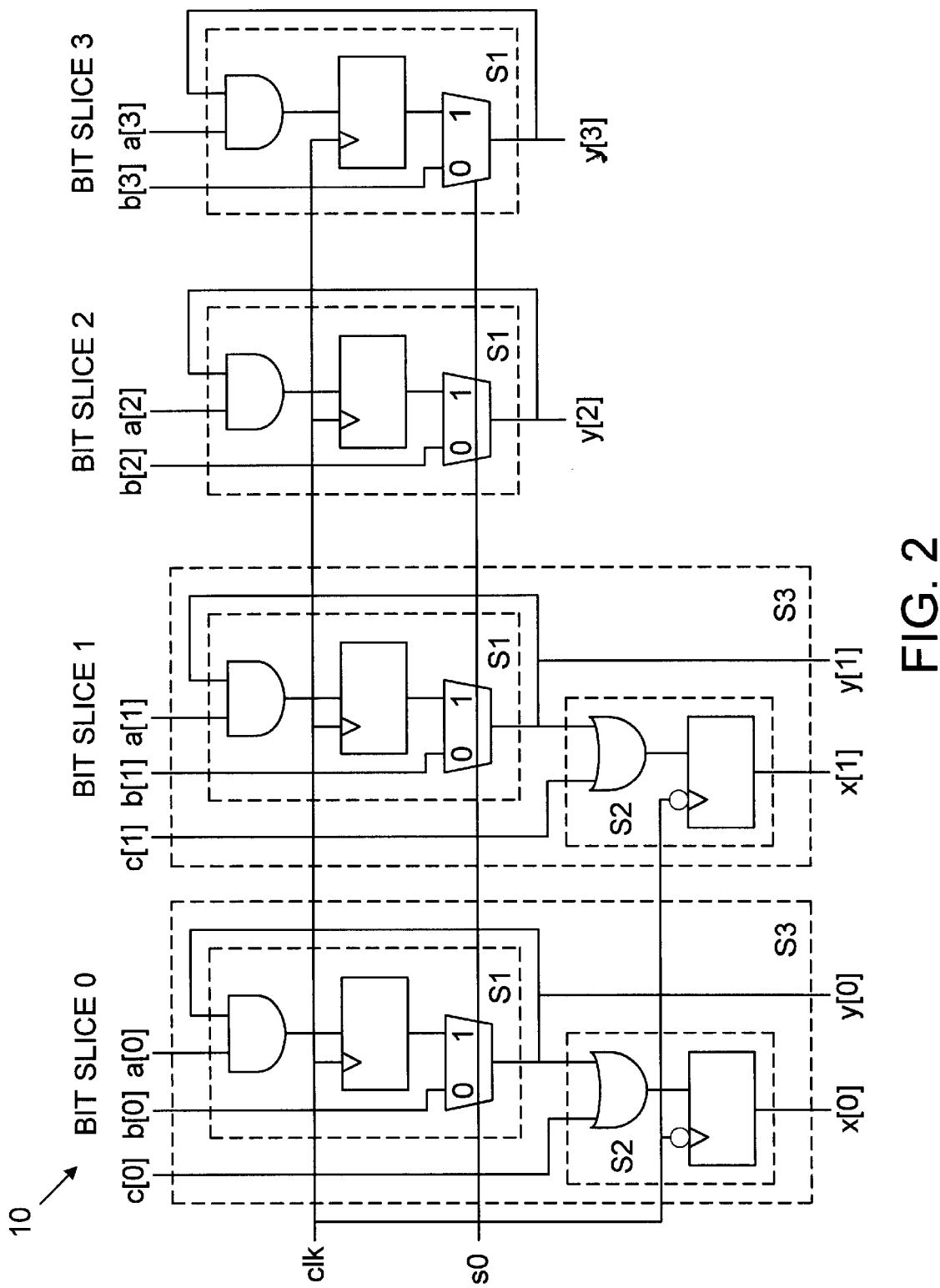
FIG. 2 is a schematic representation of a circuit and three templates that cover different portions of the circuit.

The following is an example of an HDL description.
Inputs a[3:0], b[3:0], c[3:0], s0;
Clock clk;
Outputs x[1:0], y[3:0];
begin main
  for i=0 to 3 do
    {d[i]:=a[i] AND y[i];
    e[i]:=d[i] on rising clk;
    y[i]:=if s0 then e[i]
      else b[i]}
  for i=0 to 1 do
    {f[i]=c[i] OR y[i];
    x[i]=f[i] on falling clk;}
end main;

FIG. 2 illustrates a circuit 10 that could be created from the above HDL description. Circuit 10 include four bit slices (0–3). The HDL description includes two do-loops. A first template S1 includes the elements of the first do-loop. (The "S" in S1 represents "sub".) Because in the first do-loop, i goes from 0 to 3, S1 is included in each of the four bit slices (0–3). A second template S2 includes the elements in the second do-loop. Because in the second do-loop, i goes from 0 to 1, S2 is included in only bit slices 0 and 1. A third template S3 includes S1 and S3 in bit slices 0 and 1. The invention can be used to extract regularity from the HDL description by systematically generating templates S1, S2, and S3 and then covering circuit 10 with a subset of the templates. One cover includes the four instances of S1 and the two instances of S2. Another cover includes the two instances of S3 and the two instances of S1 not included in S3. In some embodiments, as part of the cover process, S2 and the two instances of S1 included in S3 would be removed from the list of possible templates in the cover. Templates S1 and S2 are examples of a tree template and template S3 is an example of a single-PO template. From a broader perspective, templates S1 and S2 are also single-PO templates.

A maximal template is the maximum size it could be and still be a template. A submaximal template is a template within another template. For example, there are four instances of an AND gate template, which is a submaximal template because it is inside template S1. In some embodiments, such submaximal templates are not generated. In other embodiments, they are generated, but are eliminated from consideration as part of the covering process. A template may be a maximal template for purposes of tree templates, but a submaximal template when considered for single-PO templates. For example, for purposes of tree templates, S2 is a maximal template. For purposes of single-PO templates, S2 is a submaximal template because it is within template S3.

Regularity in a given circuit can be either functional, structural or topological. Given a high-level (behavioral or structural) description, a functionally-regular circuit uses a set of functionally-equivalent operations or subcircuits (templates). Functional regularity can be used to restructure the HDL code, for instance to improve the quality of high-level synthesis results by identifying opportunities for resource sharing. Structure in an HDL description typically refers to declaratively specified blocks including a netlist which can be described schematically by assigning a horizontal or vertical direction to the nets. Finally, a topologically regular design having an ordered set of blocks which gives a good initial placement for the circuit.

B2. Problem Formulation

Figure 3:
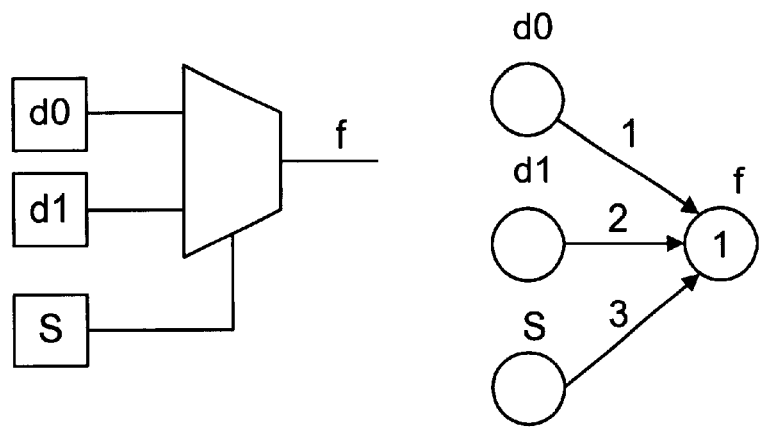
FIG. 3 is a schematic and graphical representation of a 2-to-1 multiplexer.
Figure 4:
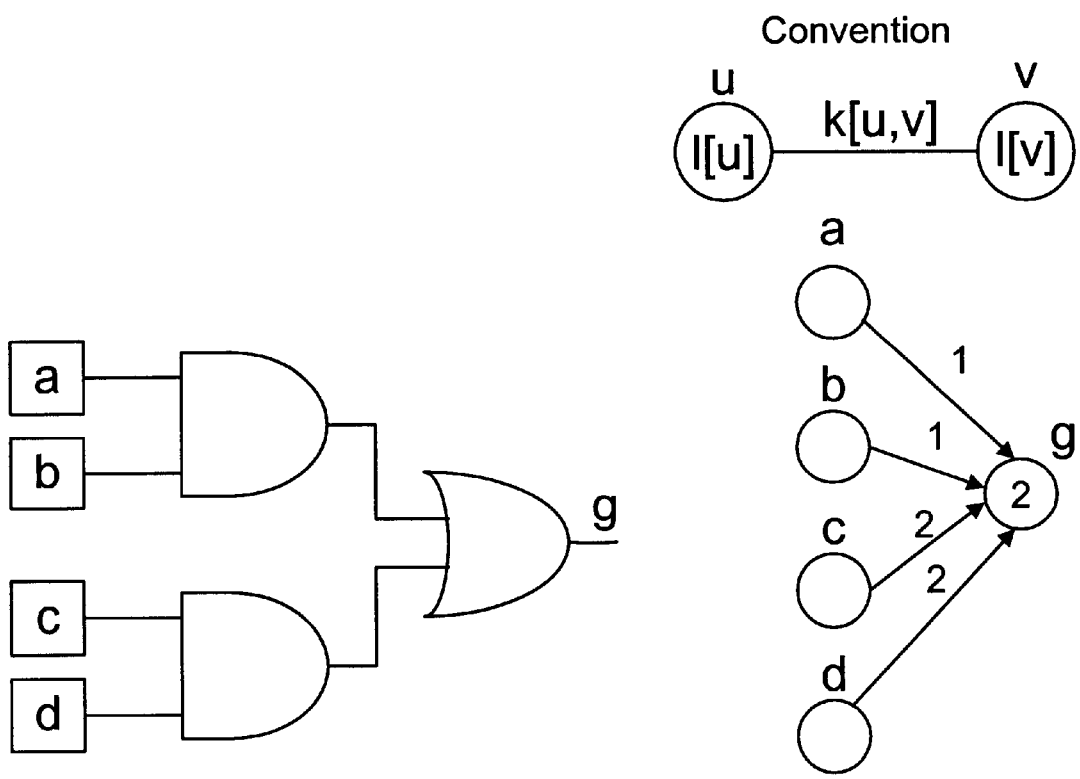
FIG. 4 is a schematic and graphical representation of an AND-OR gate.

The following provides details used in connection with some embodiments. However, the invention is not limited to the particular details. The input to regularity extraction is a circuit C composed of components that can be logic gates or arithmetic operators. C is usually described using an HDL. We may represent C by a directed graph $G(V,E)$, where the nodes in V correspond to the logic components or the primary inputs of C, and the edges in E correspond to the interconnection among the components and primary inputs of C. The set V can be partitioned into two subsets I and L, which correspond to the sets of primary inputs and logic components, respectively. The set $O$ of primary outputs is a subset of L. We represent the logic functions of components of C in G by a pair of functions. We first define a logic function $1: L \rightarrow \{1, \ldots l0\}$, where l0 is the total number of distinct types of logic functions. If $l[u]=l[v]$, then u and v correspond to the same logic function, e.g. a 2-to-1 multiplexer. Similarly, we associate an index $k: E \rightarrow \{1, \ldots, k0\}$ with every edge in e, where $k(u1,v)=k(u2,v)$ implies that the two incoming edges of v are equivalent. For example, FIG. 3 shows a multiplexer whose input edges have all distinct indices, while the AND-OR gate of FIG. 4 has four edges assigned to only two indices.

A subgraph of G is a graph $Gi(Vi,Ei)$ such that $Vi \subset V$ and $Ei \subset E$. Vi is partitioned into Ii and Li. The set Oi of primary outputs is again a subset of Li. A subgraph of G corresponds to a subcircuit of C. We consider only those subgraphs which satisfy the condition that if $v \in Li$, then $u \in Ii \cup Li$ for every node u connected to v by an edge $(u, v)$ in G. We call the subgraphs which satisfy the condition feasible subgraphs of G, since they correspond to meaningful subcircuits of C. From here on, a subgraph will imply a feasible subgraph.

We consider two subgraphs Gi and Gj functionally equivalent, if and only if (a) they are isomorphic, i.e. there exists a one-to-one mapping $\phi$ between Vi and Vj, (b) the logic functions of corresponding nodes are same, i.e. $1[v]=1[\phi[v]]$, and (c) the indices of corresponding edges are also the same, i.e. $k[u,v]=k[\phi[u], \phi[v]]$. We call the equivalence class of this relation a template. Any set S of subgraphs of G can be partitioned into m templates, $S1, \ldots, Sm$, where a template Si contains $|Si|$ subgraphs. We estimate the area of a subcircuit that corresponds to the template Si by $area[Si]=\Sigma v \in Li\ a[1[v]]$, where $a[j]$ is the area estimate of a node of logic function j.

A cover of G is a set $C(G)=\{Gi, \ldots, Gn\}$ of feasible subgraphs of G that satisfies the following conditions:

1. Every node of G belongs to at least one subgraph in $C(G)$, i.e. $V \subset V1 \cup \ldots \cup Vn$.
2. If a node v is a primary input of a subgraph, then it is either a primary input of G or an output of another subgraph, i.e. for all $v \in Ii$, $v \in I \cup O1 \cup \ldots \cup On$.

In some embodiments, a problem of regularity extraction is stated as follows. Given a circuit represented by a graph G, find a cover $C(G)=\{G1, \ldots, Gn\}$, which is partitioned into m templates $Si, \ldots, Sm$, such that the number of n of subgraphs and the overall area $\Sigma_{i=1}^{m} area[Si]$ of the templates are maximized. Maximizing the number of subgraphs will reduce the effort needed to design the circuit, while maximizing the area of templates will reduce the overall area and delay by facilitating better optimization during technology mapping and layout. The above two objectives are conflicting, since a large template usually has only a few subgraphs.

In general, finding an optimal cover is NP-complete (not polynomial time solvable), even when the subgraphs are selected from a given set. Here, the problem is even more complex, since there is no such set of subgraphs for selecting the cover. In some embodiments, the problem complexity is reduced by decomposing it into two parts, where a set of templates is first generated, followed by selecting a subset of the template set to cover G. Two sub-problems are stated below.

In some embodiments, with respect to graph covering, given a circuit represented by a graph G, the complete set of tree and/or single-PO templates is generated given certain assumptions.

In some embodiments, with respect to graph covering, given a circuit represented by a graph G and its set ST(G)={S1, . . . ,Sp} of templates, find a cover C(G, ST)={G1, . . . ,Gn} of G, which is partitioned into m($\leq$p) templates, such that $\Sigma_{l=1}^{m}$area[Si] the number n of subgraphs and the overall area $\Sigma_{l=1}^{m}$area[Si] of the templates are maximized.

B3. Complexity of Template Generation

The following are some practical assumptions used in some embodiments, which will reduce the number of templates addressed to within $V^2$(i.e., V * V). These assumptions will be justified in the context of regularity extraction.

Assumption 1. The set of templates includes all maximal templates of a given class. (The definition of templates assumes there must be at least two instances.) In some embodiments, the set may also include submaximal templates, which may be removed in the covering process.

Figure 5C:
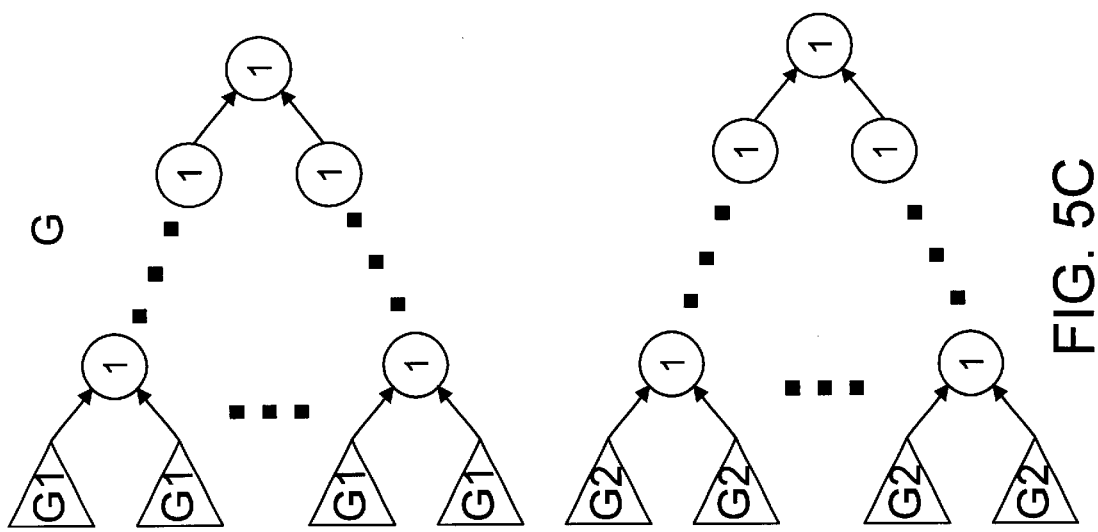
FIG. 5C illustrates a graph G with the number of templates given by $O(2^V)$
Figure 5B:
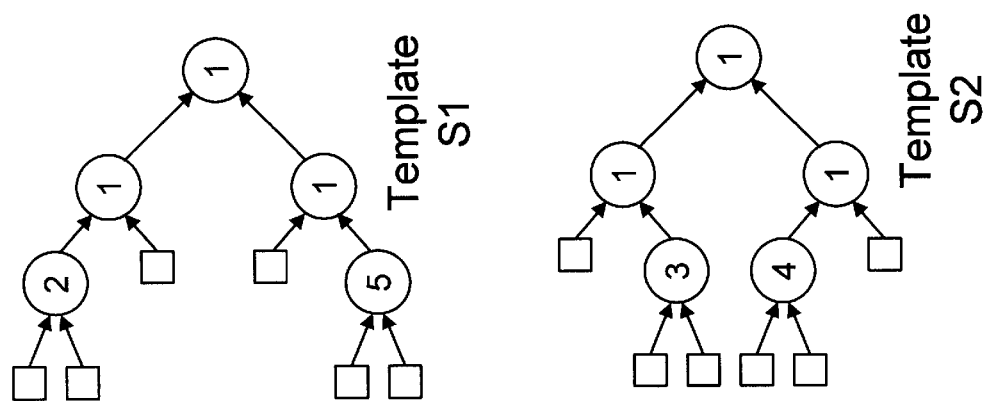
FIG. 5B illustrates two templates obtained by permuting the incoming edges of the nodes of FIG. 5A.

The number of templates can be $O(2^V)$ (i.e., on the order of $2^V$) even after considering Assumption 1. Consider the graph G' of FIG. 5A composed of two unconnected trees, where the incoming edges of every node have the same index. It has two templates shown in FIG. 5B. The graph G of FIG. 5C is composed of two unconnected binary trees such that all the internal nodes have the same function l[v]=1, while the leaf level is composed of one of the two subgraphs, G1 or G2. The number of templates of G is $O(2^V)$, since every pair of subgraphs G1 and G2 can be matched using either of the templates of FIG. 5B.

In some embodiments, we make the following assumption that does not allow permuting the incoming edges of a node even though the two edges (u1,v) and (u2,v) have the same index k[u1,v]=k[u2,v]. For example, the two input edges of a node corresponding to an OR gate would be assigned different indices, even though they are equivalent.

Assumption 2. A template is not generated through permuting gate inputs. From another perspective, for every node v of G with incoming edges from nodes u1, . . . ,uf, every edge is assigned a unique index of k[ui,v]=i, for all $1 \leq i \leq f$. In some embodiments, templates are not generated from permuted inputs. In other embodiments, the templates are generated from permuted inputs, but are eliminated in the covering process.

Figure 5A:
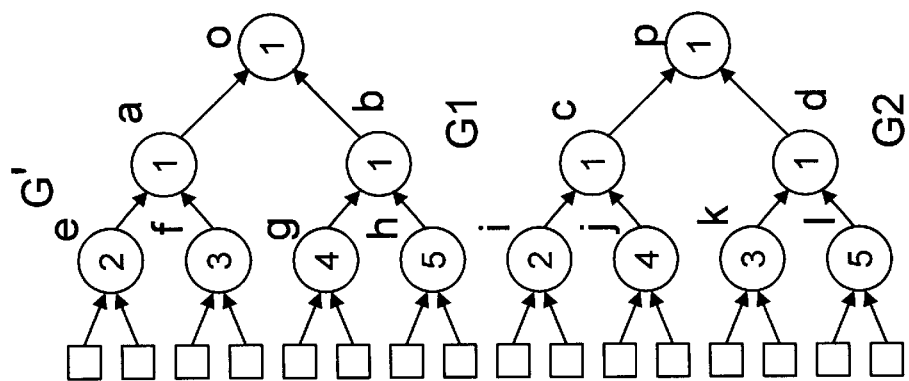
FIG. 5A is a graph G'.
Figure 6:
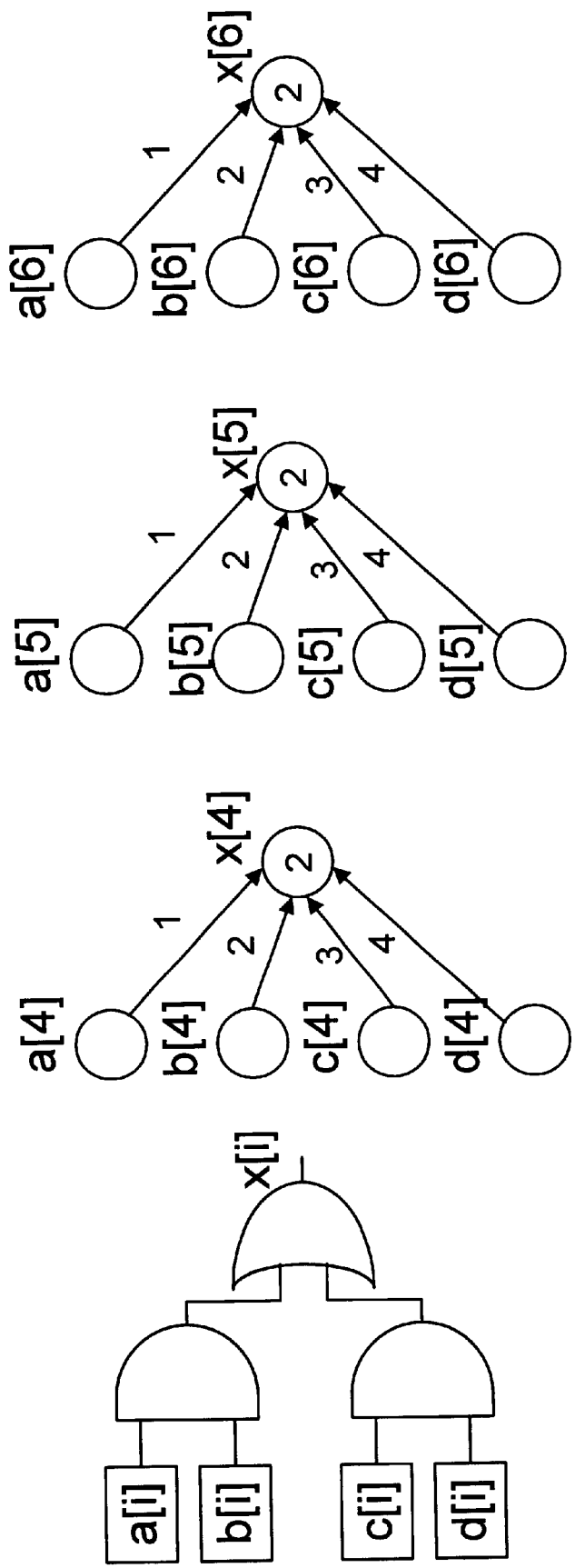
FIG. 6 illustrates representations for an HDL assignment.

Assumption 2 disallows S2 (shown in FIG. 5B) as a template for the graph of FIG. 5A because S2 would be created by permuting nodes f and g and nodes j and k. As a result, the graph G' of FIG. 5C also has a single template. The justification for the above assumption is that G is constructed from an HDL description of C, which ensures that nodes with the same function are defined identically. For example, as illustrated in FIG. 6, the HDL assignment statement "for i=4 to 6 {x[i]=a[i]b[i]+c[i]d[i]}" will correspond to three nodes which are transformed identically in building G. The above assumption does not rule out the regularity inherent in the HDL description. The edge indices are different from those in FIG. 4 as a result of Assumption 2. Different embodiments of the invention may follow Assumption 1 and/or Assumption 2 and/or other assumptions.

Details regarding generation of tree templates and single-PO templates in some embodiments are now considered.

B4. Generation of Tree Templates

A tree template is a template having a single output and no internal reconvergence. An example of internal reconvergence is a path that separates to parallel paths (where one or both of the parallel paths may have an intermediate node) and reconverges to a node. We present an algorithm (e.g., Pseudocode Sample 1) for generating all tree templates of a given graph G. Pseudocode Sample 1 assures Assumption 2 but may generate sub-maximal templates in violation of Assumption 1. However, the sub-maximal templates can be removed prior to completion of covering. It can be shown that the number of tree templates is reduced to within $V^2$ under assumptions 1 and 2, which makes the enumeration of such templates practical. We will analyze the complexity for the case where the fanin of the nodes in G is bounded. The templates are stored in a set ST={S1, . . . ,Sm} where every template Si is a class of functionally-equivalent subgraphs. In some embodiments, instead of storing each template completely, we store a template as a set of hierarchically organized templates. A template Si can be completely defined by the logic function of its root node, denoted by root_fn[i], and the list of templates children_templates[i]= {S1, . . . ,Sf} to which the subgraphs rooted at the f fanin nodes of the root node belong.

Figure 7:
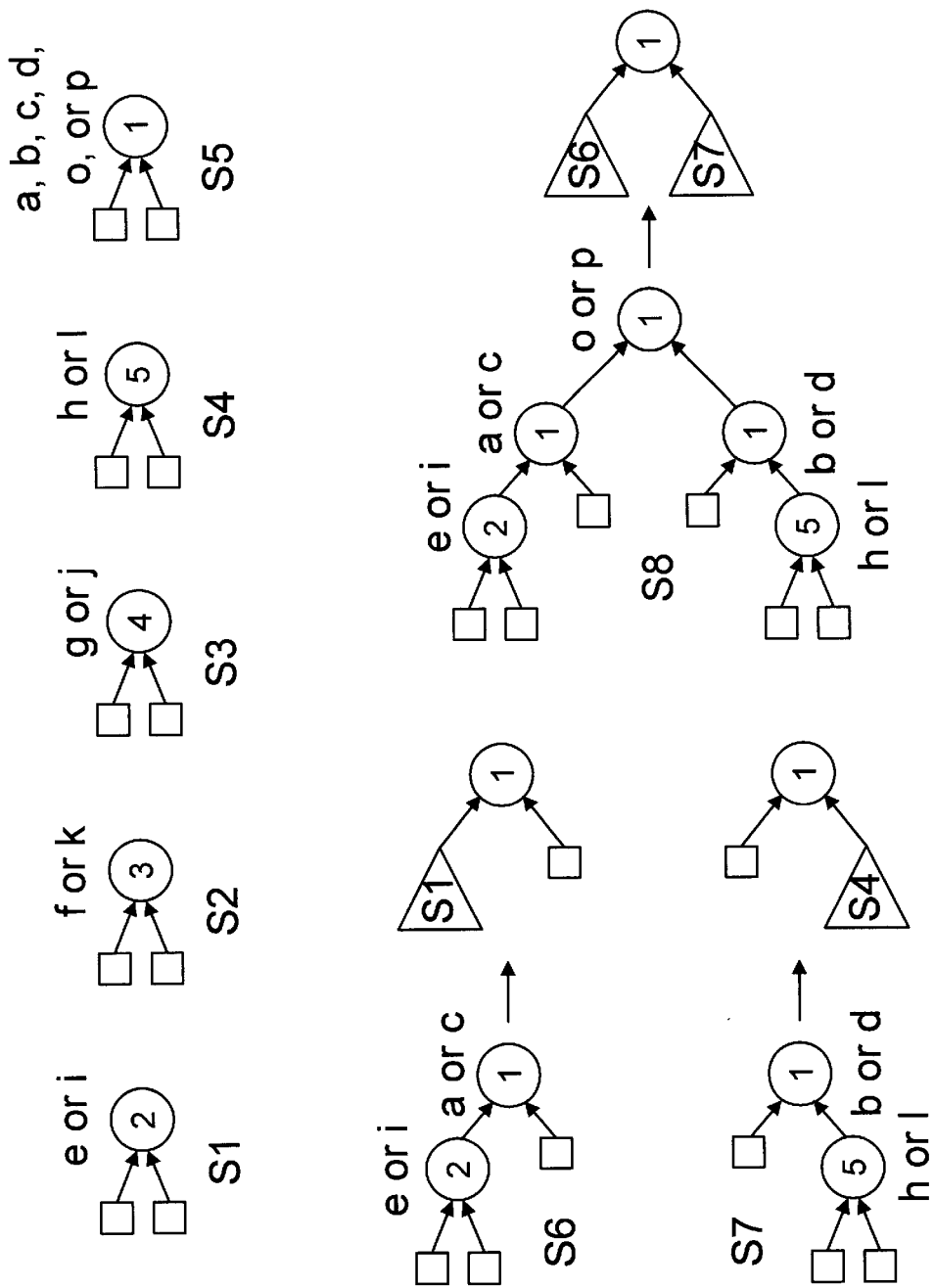
FIG. 7 illustrates tree templates for the graph of FIG. 5A.

For example, FIG. 7 illustrates templates S1, . . . , S8 of the graph G' (in FIG. 5A). The template S8 can be precisely defined by root_fn[8]=1 and children_templates[8]={S6, S7}. We also reduce the space required for storing the subgraphs of each template by simply storing the root node of the subgraphs in the list root_nodes[i]. In case of the template S8 in FIG. 7, root_nodes[8]={o,p}. It can be shown that the subgraphs of a template Si can be precisely reconstructed using root_fn[i], and the lists children_templates[i] and root_nodes[i].

For efficiency reasons, the template list ST may be sorted by a composite key of size f+1, defined as key={root_fn, children_templates}, where f is the number of fan-in nodes. A tree template generation algorithm as used in some embodiments of the invention is presented in Pseudocode Sample 1, below:

/* A tree template Si is completely defined by (i) root_fn[i] (logic function of the root node); (ii) children_templates[i] (a list of children templates that form Si); (iii) root_nodes[n] (a list of the root nodes of subgraphs of Si (all the subgraphs of Si can be constructed form these three fields)) */

```
01  Generate_Templates(G(V,E))
02  begin
03    topologically sort the nodes of G as {v1, . . ., VN};
04    ST := Ø; /* ST stored the list of templates */
05    m := 0; /* m is number of templates generated so far */
06    templates [v1 . . . VN, v1 . . . VN] := 0;
      /* template [vi . . . vj], if non-zero, gives the index of template to which
      functionally-equivalent subgraphs rooted at nodes vi and vj belong */
```

-continued

```
07  for i = 1 to N
08    for j = i + 1 to N
09      m := m + 1; /*new template to be stores in Sm */
10      Sm := Largest_Template(vi, vj);
        /* generates a template with two largest functionally-equivalent
        subgraphs
        Gi and Gj rooted at vi and vj, respectively */
11      if Sm = Ø
12        k := Find_Equivalent_Template(Sm, ST); /* find Sk in ST
          equivalent to Sm */
13        template[vi, vj] := k;
14        if k = m /* Sm is a new template */
15          ST := ST ∪ {Sm}; /* add Sm to ST, such that it remains sorted
            */
16        else
17          root_nodes[k] := root_nodes[k] ∪ {vi, vj};
18          m := m - 1;
19  return ST;
20  end
    /* generates largest trees rooted at u and v that are functionally equivalent */
21  Largest_Template (u, v)
22  if 1[u] ≠ 1[v] /* u and v have different logic functions */
23    return Ø;
24  else
25    root_fn[m] := 1[u]; /* setting fields of template Sm */
26    for i = 1 to f do
      /* both u and v each have f fanin nodes, {u1, . . ., uf} and {v1, . . ., vf}
      */
27      if ui and vi have a single fanout each
28        add template [ui, vi] to children_templates [m];
29      else add Ø to children_templates[m];
30    root_nodes[m] := {u, v}; /* Sm has two subgraphs, Gu and Gv */
31  return Sm;
    /* ST is a list {Si, . . ., Sj} of templates sorted by key = (root_fn,
    children_templates).
    This function finds the template in ST, equivalent to Sm, by performing a
    binary search on ST = {Si, . . ., Sj} */
32  Find_Equivalent_Template (Sm, ST)
33  if ST = Ø
34    return m
35  if key[m] < key [(i + j)/2] /* check first half of ST */
36    return Find_Equivalent_Template (Sm, {Si, . . ., S((i + j)/2 + 1)});
37  else if key[m] > key [(i + j)/2] /* check second half of ST */
38    return Find_Equivalent_Template(Sm, {S((i + j)/2 + 1), . . ., Sj});
39  return (i + j)/2; /* S(i + j)/2 and Sm are equivalent */
```

Pseudocode Sample 1

It should be emphasized the invention may be implemented with different details than those recited in Pseudocode Sample 1. Pseudocode Sample 1 generates a complete set of tree templates meeting Assumption 2. Some embodiments could use an algorithm that generates a smaller set of tree templates than does Pseudocode Sample 1. Further, an algorithm could generate a complete or partial list of single output templates that may include reconvergence, although the complexity may be significantly greater than with Pseudocode Sample 1.

An example of the operation of Pseudocode Sample 1 can be given with reference to FIG. 7. First, the nodes of G are topologically sorted (line 03). Topologically sorting means sorting from primary inputs to outputs (or left to right). A number level is assigned to each node. For example, in FIG. 5A, a first level includes nodes e, f, g, h, i, j, k, and 1; a second level include nodes a, b, c, and d; and a third level includes nodes o and p. In line 06, the template has two indices, where each index represents each node. The loops of lines 07 and 08, cause each node pair to be considered. For every pair of nodes, the function Largest_Template generates a template with two subgraphs, one rooted at each node. Largest_Template compares the logic function of the two nodes, and then constructs the list of children templates. The template Sm, thus generated, is compared with previously-generated templates by a binary search on ST using key. If Sm is equivalent to an existing template Sk, then its subgraphs are added to Sk; otherwise Sm is stored in ST as a new template. Referring to FIGS. 5A and 7, first the trivial templates S1, . . . ,S4 are generated. Then, from the remaining nodes {a, b, c, d, o, p}, S5 is generated by comparing a and b, and S6 is generated by comparing a and c. The template obtained by comparing a and d is found to be equivalent to S5, so d is stored in the root_nodes of S5. The remaining two templates S7 and S8, are generated by comparing the node pairs, (b,d) and (o,p), respectively. Largest_Template returns a NULL template, in the case of remaining node pairs. Note that every template has only two subgraphs, except S5 with six subgraphs given by root_nodes={a,b,c,d,o,p}.

Largest_Template works recursively and starts from the leafs (inputs) and works toward the rootnode (output) of the tree template, so that a larger template is constructed from smaller templates. Referring to FIGS. 5A and 7, the rootnode of the template S8 is node o or p, which is the right most node of S8 in FIG. 7. The rootnode of S6 is node a or c. The rootnode of S7 is node b or d. Templates S6 and S7 are constructed before template S8. The rootnode of S6 and S7 are children with respect to S8. The intermediate rootnode of templates S6 and S7 they are joined to node a or c and node b or d (see FIGS. 5A and 7) to form template S8.

Lines 26–28 assure that Assumption 2 is met by disallowing input permutations.

In some embodiments, Largest_Template takes a constant time for bounded-fanin graphs. Binary search on ST (lines 32–39) as well as insertion of Sm in ST (line 15) take O(logV) time, both of which are called for every node-pair. Thus, the overall time complexity is $O(V^2 \log V)$. We store root_fn and children_templates for every template, which requires a memory of $O(V^2)$. The storage required for subgraphs is also $O(V^2)$, since a subgraph is stored just as its root node. Thus, the overall storage complexity is $O(V^2)$.

The Find_Equivalent_Template function (lines 32–29) is used to find a short hand way to identify a template. For example, if a template is created, it may contain a fairly large amount of information to specify its nodes. Another instance of the template can be expressed with much less information by merely observing that it is the same as the first template.

B5. Multi-output Templates

The template generation algorithm Pseudocode Sample 1 gives excellent covers for datapath circuits composed of sparsely interconnected subcircuits, but it might not perform well for circuits with a high number of multiple-fanout nodes. More specifically, in addition to generating tree templates, some embodiments of the invention can generate a special class of multi-output templates referred to herein as a single principal-output (PO) subgraph (template). A single-PO subgraph is a multi-output subgraph, whose every output lies in the transitive fanin of a particular output. For example, in FIG. 2, template S3 is an example of a single-PO template because it is a multi-output template (it has outputs x and y), but output y is in the transitive fanin of output x.

Single-PO graphs have several interesting properties. They can have internal reconvergence as well as cycles, and can have any number of outputs, in contrast to trees. A main advantage of using single-PO subgraphs is that despite their complex structure, the number of such subgraphs of G under the Assumptions 1 and 2 is also restricted to $V^2$, provided the subgraphs satisfy the convex property that if u, v∈V (Gi), then every node w on a path from u to v also belongs to V(Gi).

Figure 8:
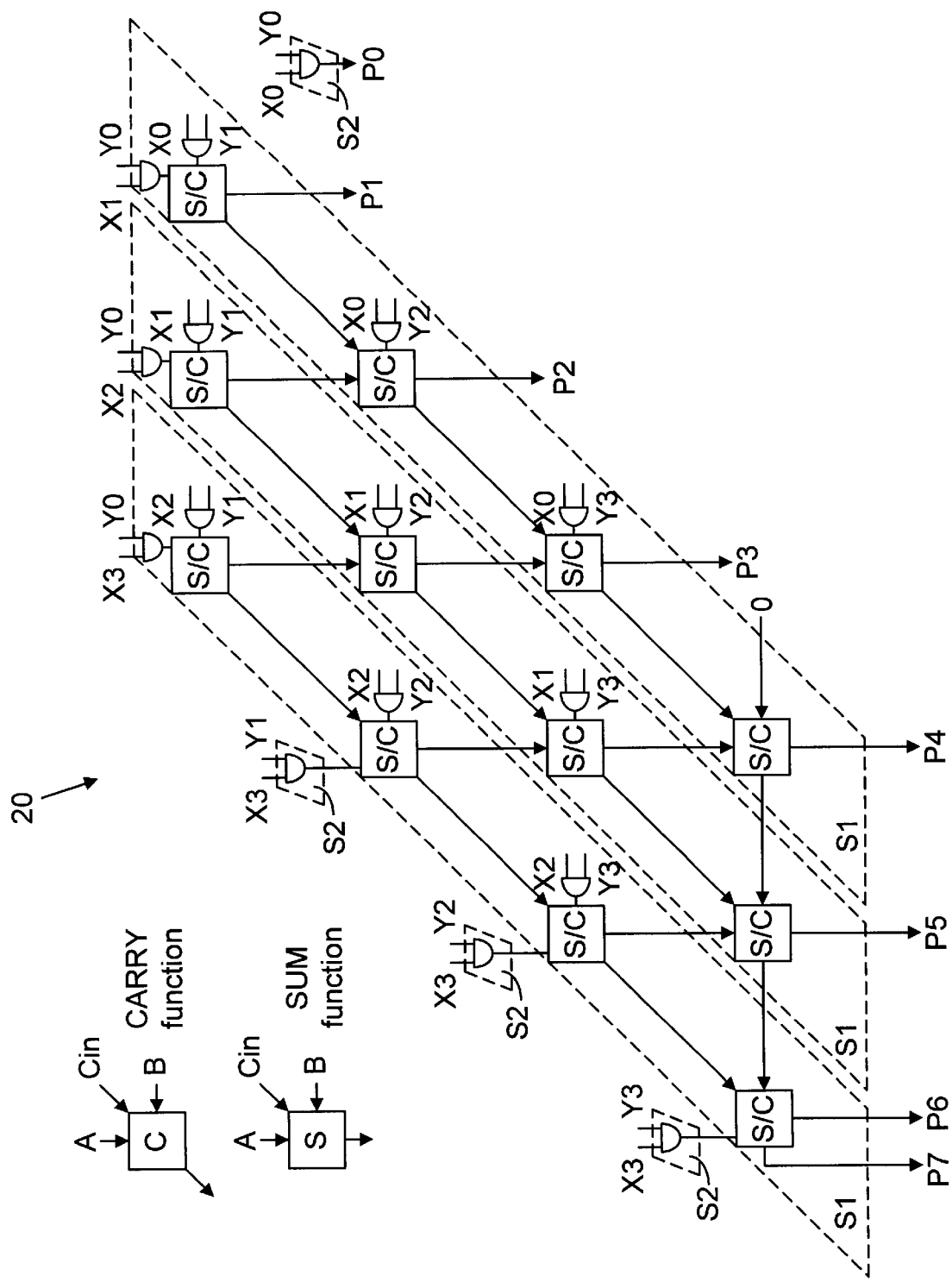
FIG. 8 is a schematic representation of a multiplier circuit which is covered by different instances of two templates.
Figure 9:
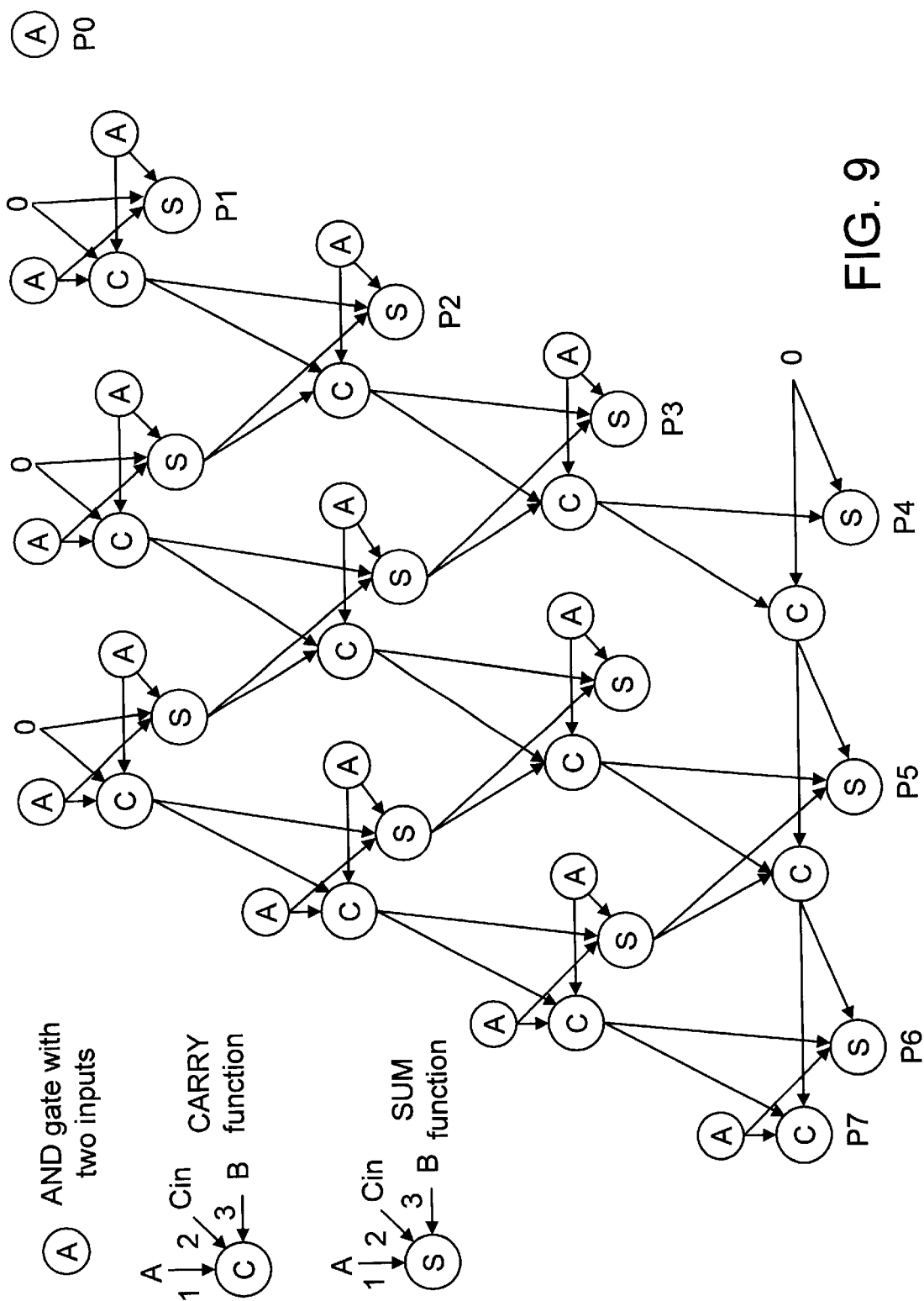
FIG. 9 illustrates a graph corresponding to the multiplier of FIG. 8.
Figure 10:
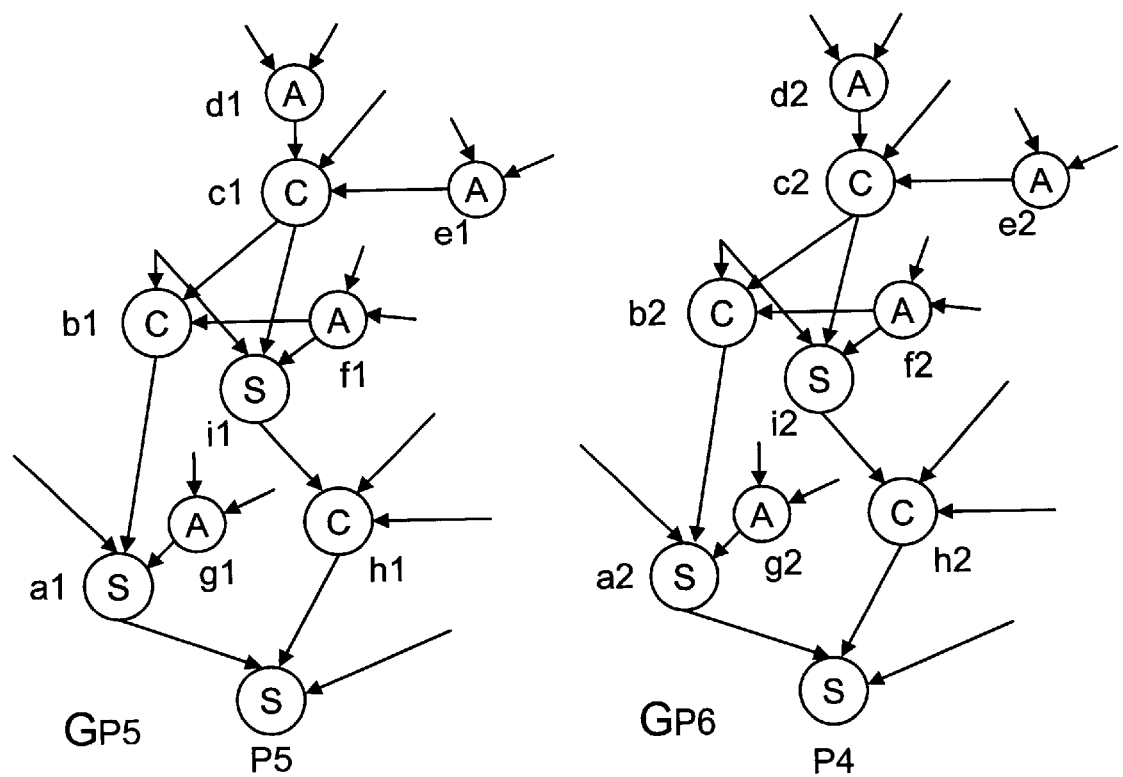
FIG. 10A illustrates two functionally-equivalent subgraphs of the graph of FIG. 9.
FIG. 10B illustrates two templates with overlapping nodes.
FIG. 10C illustrates a template formed from merging the two templates of FIG. 10B.

As another example, FIG. 8 illustrates a 4×4 multiplier 20, in which a template S1 includes diagonal arrays and a templates S2 includes AND gates. C/S represents the CARRY and SUM functions. Multiplier 20 is covered by 3 instances of template S1 and 4 instances of template S2. Template S1 is not a tree template. Accordingly, if we apply the algorithm of Pseudocode Sample 1 to the multiplier of FIG. 8, then numerous instances of three trivial tree templates: AND gate, CARRY and SUM functions, are obtained. Template S1 is also not a single-PO template. Nevertheless, as illustrated and described below, the three diagonal arrays of FIG. 8 include single-PO templates. FIG. 9 is a graph version of multiplier 20 of FIG. 8. The two subgraphs shown in FIG. 10A are two functionally-equivalent single-PO subgraphs GP5 and GP6, with P5 and P4 (see FIG. 9) as the respective principal outputs. A single-PO template has instances of single-PO subgraphs.

Figure 10B:
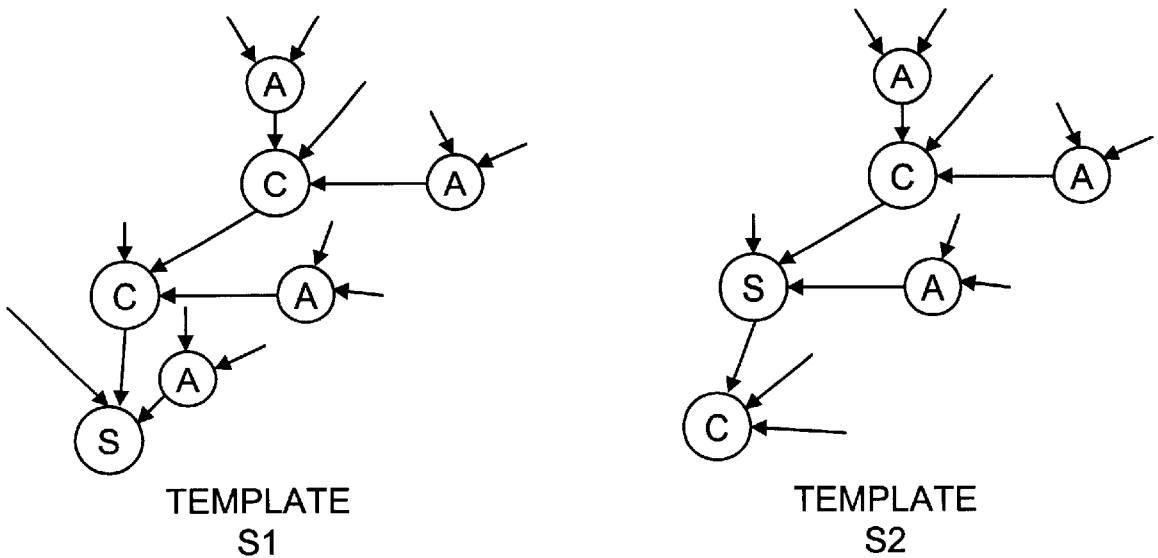
Figure 10C:
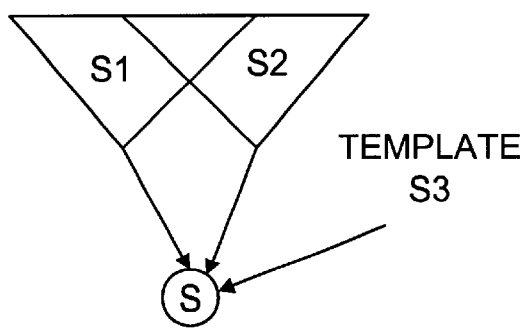

As described above, a tree template may be represented by a list of children templates which are non-overlapping. However, the children templates can overlap in single-PO templates. FIG. 10B illustrates templates S1 and S2 of the graph of FIG. 10A. FIG. 10C shows the template S3 with two subgraphs of FIGS. 10A and 10B. S3 has two children templates, S1 and S2, which have overlapping nodes, such as c1 of subgraph GP5 and c2 of GP4. Therefore, S3 cannot be completely specified just by the list of its children templates. Instead, every template is specified individually. The nodes of a subgraph Gu can be stored by a list nodelist using the depth-first search order. A depth-first order may be unique for all isomorphic subgraphs. The subgraph of template Si rooted at node a1 has nodelist={a1, b1, c1, d1, e1, f1, g1}. With every node in nodelist, we store its fanin and fanout links as well. Thus, in some embodiments, memory required to store a subgraph is O(V) for bounded-fanin graphs.

Pseudocode Sample 2, below, may be used to generate a complete set of single-PO templates.

Repeat lines 01–20 of pseudocode Sample 1

```
01  Largest_Template(u, v)
02  if 1[u] ≠ 1[v]
03      return ∅;
04  else
05      nodelist[Gu] := {u}; /* root node is the first node in nodelist*/
06      nodelist[Gv] := {v};
07      for i = 1 to f do /* u and v each have f fanin nodes {u1, . . ., uf} and
            ({v1, . . ., vf}) */
08          add nodelist [Gui] at the end of nodelist [Gu];
09          add nodelist [Gvi] at the end of nodelist [Gv];
10          for w1 ∈ nodelist [Gui] and w2 ∈ nodelist [Gvi];
    /* there is a path from w1 (w2) to u (v) through the incoming edge of u (v)
    with index i */
11              add i to path[w1, u];
12              add i to path[w2, v];
13      for w1 ∈ nodelist [Gu] and w2 ∈ nodelist[Gv]
14          if path [w1, u] ≠ path[w2, v]
15          delete all copies of w1 (w2) from nodelist [Gu] (nodelist [Gv]);
16          else if path [w1, u] has more than one element /*here, path [w1, u] =
            path[w2, v] */
17          delete remaining copies of w1(w2) from nodelist [Gu] (nodelist [Gv]);
18  Sm := {Gu, Gv};
19  return Sm;
    /* ST is a list of k templates S1, . . ., Sk. This function finds the
    template ST, equivalent to Sm, if any; otherwise returns m */
20  Find_Equivalent_Template(Sm, ST)
21  for i = 1 to k
```

```
22    if nodelist [Si] = nodelist [Sm]
23        return i;
24 return m;
```

Pseudocode Sample 2

It should be emphasized the invention may be implemented with different details than those recited in pseudocode Sample 2. A complete set of single-PO templates includes at least all those single-PO templates in the circuit that meeting Assumptions 1 and 2, above. It may also include additional single-PO templates, some or all of which may be removed from the list of templates later, for example, as part of or prior to covering the circuit.

As can be observed, pseudocode Sample 2 is the same as Pseudocode Sample 1 except that the function Largest_Template (u, v) (called from line 10) and the function Find_Equivalent_Template (Sm, ST) (called from line 12) are different. As described above, a reason for the difference is that with single-PO templates, children templates can overlap (e.g., see FIG. 10C).

An example of the operation of Pseudocode Sample 2 is provided in connection with FIGS. 10A, 10B, and 10C. Prior to the call Largest_Template (P5, P4), the template Si is already generated with two subgraphs, Ga1 and Ga2. Similarly, S2 is also generated with subgraphs Gh1 and Gh2. The nodelists of Ga1 and Gh1 (Ga2 and Gh2) are combined to obtain the nodelist of GP5 (GP4). After lines 07–09, nodelist[GP5]={P5, a1, b1, c1, d1, e1, f1, g1, h1, i1, c1, d1, e1, f1} and nodelist[GP4]={P4, a2, b2, c2, d2, e2, f2, g2, h2, i2, c2, d2, e2, f2}.

There can be multiple paths from a node w to the root node v through different incoming edges of v. As a result, w occurs multiple times in nodelist [Gv]. For example, c1 is connected to P5 through the edges (a1, P5) and (h1, P5) in FIG. 10A, and hence, it occurs twice in nodelist [GP5]. We define a list path[w, v] (lines 10–12) which contains the indices of the incoming edges of v through which w is connected to v, e.g. path[b1, P5]={1}, while path[ci, P5]= {1,2}. We then pairwise compare the nodes in nodelist of Gu and Gv (line 13). If the path lists of the corresponding nodes are different, then these nodes have to be removed from the respective subgraphs (lines 14–15). Otherwise, if the two path lists are same, but have multiple indices, then the remaining copies of these nodes have to be removed. For example, the second occurrence of the node c1 (c2) in GP5 (GP4) is deleted. Finally, after line 21, nodelist[GP5]={P5, a1, b1, c1, d1, e1, g1, h1, i1} and nodelist [GP4]={P5, a1, b1, c1, d1, e1, g1, h1, i1} and nodelist [GP4]={P4, a2, b2, e2, g2, h2, i2}. The function Find_Equivalent_Template compares a template with every other template in the set ST by matching corresponding nodes in the two nodelist's, since the depth-first order of the nodes of a graph is unique.

In some embodiments, Largest_Template takes O(V) time, since it constructs two nodelist's and then traverses them twice. Find_Equivalent_Template takes $O(V^3)$ time, since it compares two nodelist's at most $V^2$ times. These two functions are called for every node-pair (line 07–08, Pseudocode Sample 1), resulting in the time complexity of $O(V^5)$. The nodelist of every subgraph requires a storage of O(V), resulting in a storage complexity of $O(V^3)$. If the number of single-PO templates of G is bounded by S, then the overall time and space complexity may be given by $O(S^2 V)$ and $O(S V)$, respectively.

If designer provides a template GT, we can generate all its complete as well as partial matches in the input graph G by calling the function Largest_Template (line 10, Pseudocode Sample 1) for every node-pair (vi, vj) where vi and vj belong to G and GT, respectively. This feature allows the designer to control the extraction approach and improve the circuit cover as desired.

B6. Covering of Graph by Templates

The above described algorithms generate a set of ST templates for G. ST can be either a set of all tree templates or a set of all single-PO templates of G under the Assumptions 1 and 2. The set of all templates generated includes the sum of the sets of templates of the different classes of templates (e.g., ST=ST(TreeTemplates)+ST(Single-POTemplates).)

In many circuits, all components and associated paths of the circuit can be included in at least one template. However, other circuits may include one or more components that cannot be in a template because they appear only once. Accordingly, the phrase "covering the circuit" means to cover those components of the circuit that are included in an instance of a generated template. In some embodiments, in some cases, a component may initially be part of an instance of a template, but can be left out of a template during the covering process. In many circuits, there will be many possible covers (combinations of instances of templates that include the entire circuit). In that case, the "subset of the templates" will be fewer than all generated templates. However, where the only possible cover involves using instances of all generated templates, the phrase "subset of the templates" includes all the generated templates.

If sub-maximal templates are generated, Assumption 1 (only maximal templates) is met during the covering process.

Let S denote the set of all subgraphs in the templates stored in ST. Now, we present a solution to the graph covering problem, where given G and ST, the objective is to find a subset C(G, ST) of the set S of all subgraphs that forms a cover of G.

In some embodiments, heuristics are used to select the cover. In some embodiments, the following process is used. First, a template Si with a maximum objective function out of all templates in ST is selected. (A template with the maximum objective function is the one that most meets the heuristic or is the tie breaking template in the case of a tie.) Next, all nodes that belong to the non-overlapping subgraphs of Si are deleted and other templates of ST are removed from a list of templates. Then, a new set ST of templates for the remaining graph (uncovered circuit) is generated, which regeneration may result in different templates than existed before the templates of ST other than Si were removed from the list. A new template Si with a maximum objection function is selected. This process is repeated until either all nodes of G are covered, or ST is found to be NULL. If some nodes are left uncovered and ST becomes NULL, then the remaining nodes may be stored in a template with a single subgraph. (In case of datapath circuits, this template correlates to its control logic.)

Note that in the process of regenerated templates ST for the remaining graph, there may be nodes that are not contained in a template because there is no repetition, although they were initially in an instance of a template.

Non-overlapping subgraphs of Si are ones in which there is not a node (component) shared by the two. Overlapping subgraphs of Si are ones in which there is a node (component) shared. For example, in FIG. 2, if the AND gate of S1 of bit slice 1 were deleted, but the output of the AND gate of S1 of bit slice 0 were fed into the input of the latch of S1 of bit slice 1, then, in some embodiments, they would be overlapping subgraphs of S1. In the covering process, the latch and MUX of bit slice 1 may not be included in a template after regeneration of templates.

In other embodiments, first, template Si is selected. Next, all nodes inside template Si are deleted, but other templates in ST are retained as is. Then, another template Si is selected from the remaining templates in ST, rather than regenerating a new set of ST for the uncovered portion of the circuit. It is possible that a better cover will be obtained by regenerating the set of templates, but it also takes more time.

The following are two covering heuristics based on an objective function that may be used for selecting templates.

1. Largest-Fit-First (LFF) heuristic: Select the template Si with the maximum area area[Si].
2. Most-frequent-Fit-First (MFF) heuristic: Select Si with the maximum number |Si| of subgraphs (instances). In some embodiments, heuristic 2 is further modified as follows. Where two templates have an equal number of instances, and one template is larger than another, the larger template is selected as Si. Heuristic 2 might also be modified such that a submaximal template must have at least two nodes to be selected where an instance of the submaximal template is included in a template with more than one node.

Usually, the MFF and LFF heuristics give different covers, since a template with a large area has few subgraphs, and vice-versa. Heuristics other than LFF and MFF (e.g., combination of the LFF and MFF) could be used, and there may be additional modifications (e.g., as mentioned with respect to the MFF).

Consider examples with respect to FIG. 2. If the LFF heuristic is chosen, template S3 is selected as Si. Templates S2 and the two instances of templates S1 in the instances of template S3 are removed from consideration. In some embodiments, the other two instances of template S1 (bits slices 2 and 3) would be deleted, but templates for the remaining portion of the circuit (i.e., bit slices 2 and 3) would be regenerated. In other embodiments, templates in the remaining portion of the circuit (i.e., the circuit other than in instances of S3) are not deleted and not regenerated. Whether retained or regenerated, the two instances of S1 would then be selected to cover the remaining portion of the circuit. The result would be the circuit is covered by instances of S3 for bit slices 0 and 1 and instances of S1 for bits slices 2 and 3.

If the MFF heuristic is chosen, template S1 would be selected as Si. There are also four instances of AND, latch, and MUX components but (1) S1 is larger and (2) the AND, latch, and MUX templates have only one node (component) each. If the two latches in S2 were the same as the latch in S1, there would be six instances of the latch. However, in some embodiments, that latch would not be selected, because such a template would have only one node and S1 would have more than one node (note modification to Assumption 1). (One disadvantage of allowing single node templates is it could break up other larger templates that would be more useful.) Once template S1 are selected, all sub-maximal templates in S1 are removed from consideration. Then, depending on the embodiment, template S2 is either removed and regenerated, or simply retained. The final cover would be four instances of template S1 and two of template S2.

The cover of the 4×4 multiplier of FIG. 9 obtained using the LFF heuristic contains six templates, where the largest template shown in FIGS. 10A and 10B covers more than half of the circuit. (The cover of two templates shown in FIG. 8 cannot be obtained, since our algorithm is restricted to tree and single-PO templates.) If the MFF heuristic is used, then the cover of three small templates-AND gate, CARRY and SUM functions, is obtained.

B7. Applications of Template Generation

The following are some useful extensions of the above-described template generation algorithms.

Figure 12:
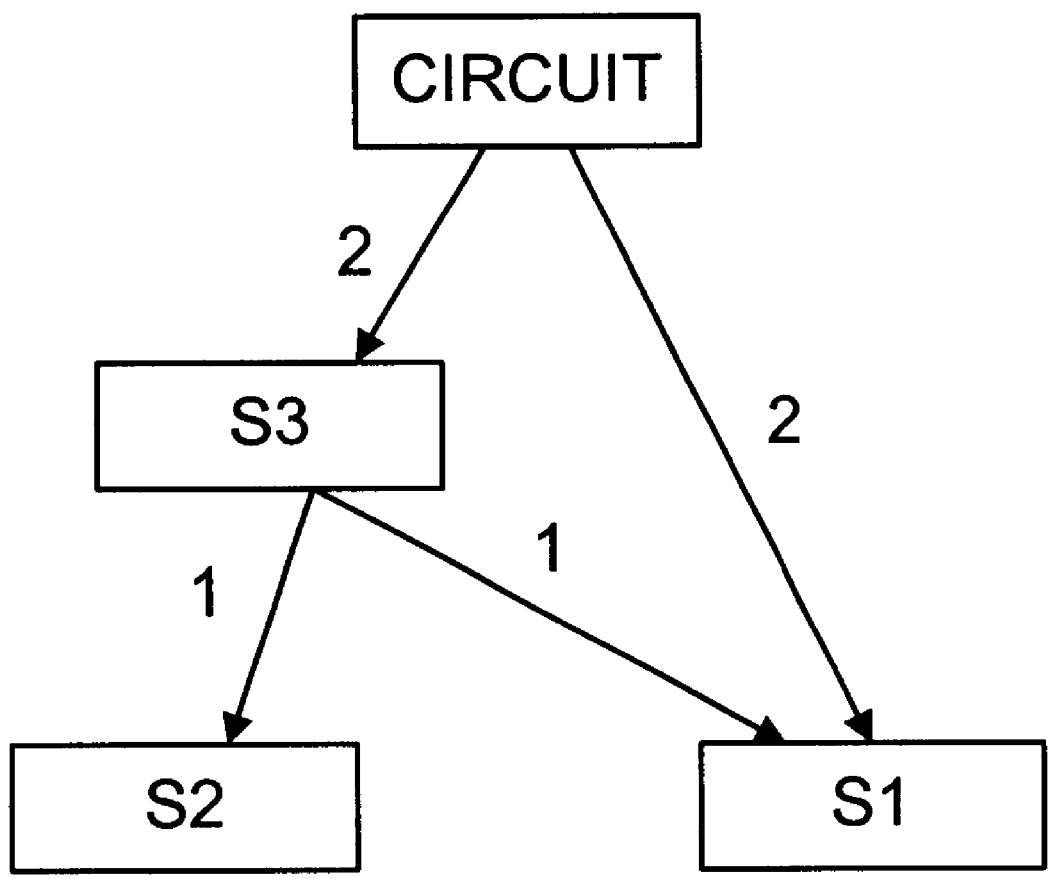
FIG. 12 illustrates a template hierarchy of the circuit of FIG. 2.

Hierarchical representation of regularity: Consider the two covers for the circuit graph of FIG. 2 generated by the extraction approach described above: one with two subgraphs of S3 and S1 each, and another one with two subgraphs of S2 and four of S1. The fact that S3 is composed of S1 and S2 is not captured by these two covers. We can compactly represent these two covers by identifying the hierarchy of templates. As describe above, in the case of tree templates, a template is stored hierarchically as a set of children templates. This notion of template hierarchy can be generalized. For a given G, every template is either hierarchically composed of other templates or is a leaf template. Let S1, . . . , Sm be the templates in a cover generated by a regularity extraction approach, described above. The complete template hierarchy can be generated by recursively extracting the regularity from the graph composed of m independent subgraphs, S1, . . . , Sm, until we are left with leaf templates only. The templates in the two covers of FIG. 2 can be compactly represented by the hierarchy shown in FIG. 12. In general, any set of covers of G can be represented by a template hierarchy, which allows the user to select the most desirable cover for subsequent physical design stages.

Generating subgraphs for a user-given template: Given a template S', a template generation algorithm can be modified to identify all subgraphs of S' as well as its children templates. For example, if the user provides the template S3 for the circuit of FIG. 2, then all subgraphs of S3 as well as its children templates S1 and S2 can be generated. A user might also specify template S1 of FIG. 8. In some embodiments, the only modification to the template generation algorithm of Pseudocode Sample 1 is that the function Largest_Template (line 10) is called for every node-pair (vi, vj), where vi and vj belong to G and S', respectively. The covering can be easily generalized such that G is covered by a mix of user-specified and automatically-generated templates.

Figure 11B:
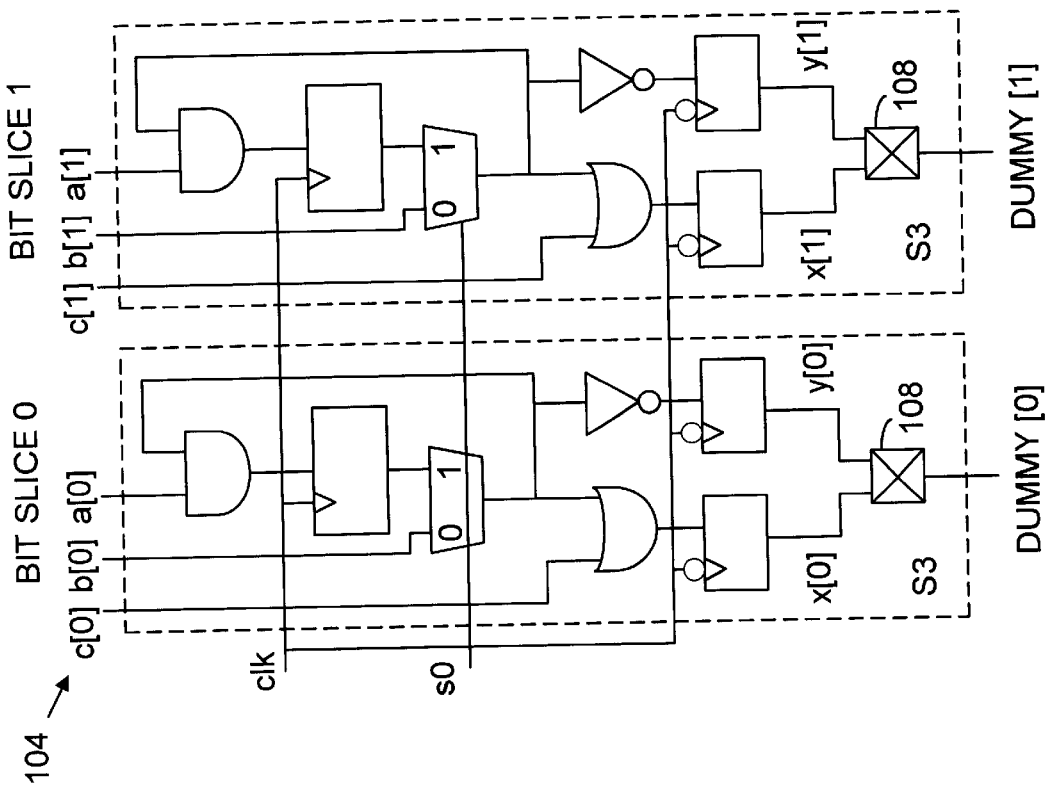
FIG. 11B illustrates a datapath circuit with a dummy node and a cover of a single template using a single dummy output bus.
Figure 11A:
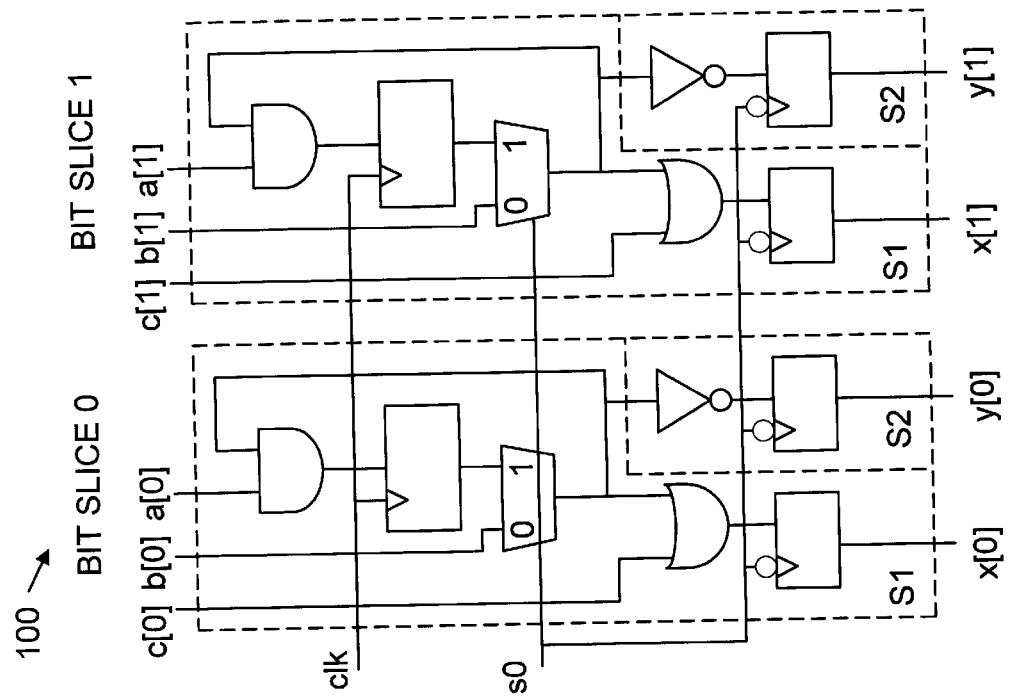
FIG. 11A illustrates a datapath circuit and a cover of two single-PO templates.

General multi-output templates: Usually, the primary outputs of datapath circuits are specified by busses. The primary outputs can be group with the same bus index to form a dummy node, thus creating a dummy bus of the same width. A heuristic of adding a dummy output bus can be used such that a template generation algorithm finds a general multi-output template. For example, FIG. 11A illustrates a circuit 100 having bits slices 0 and 1 that are each by templates S1 and S2. As illustrated in FIG. 11B, circuit 100 can be modified to create a circuit 104 in which output busses x and y are grouped with a dummy node 108 so as to create a single dummy bus and a template S3 formed in place of S1 and S2. Each bit slice of circuit 104 can be covered by a single template S3. After the regularity has been extracted, the dummy bus [0] and dummy node 108 can be ignored at a later stage of design.

C. Structural Regularity Extraction

A functional regularity extraction component of a computer-aided design system according to one embodiment of the present invention has been described. This section further describes a structural regularity extraction component as referred to in block 6 of FIG. 1.

Figure 13:
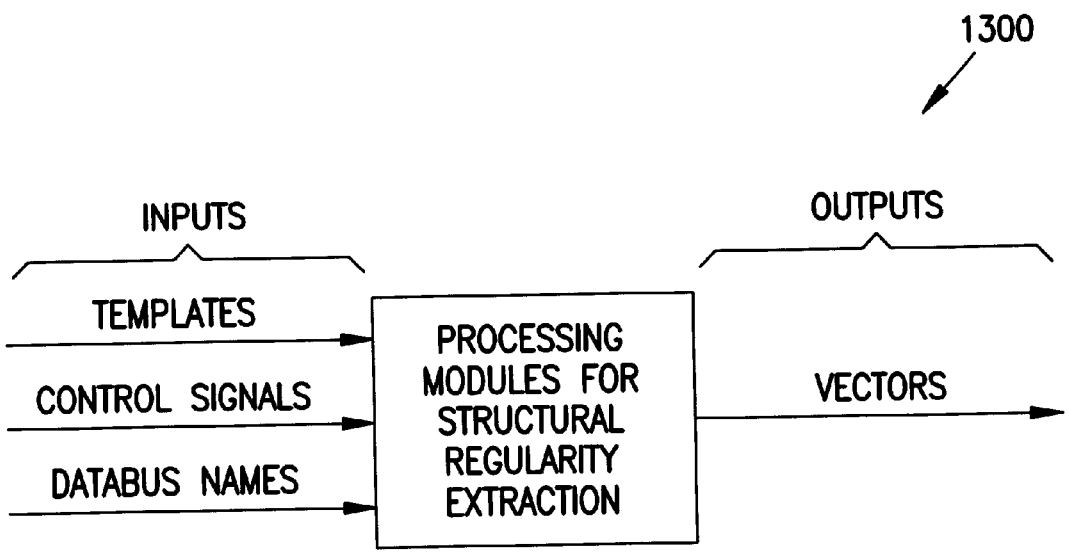
FIG. 13 is a block diagram of an example embodiment of the structural regularity extraction component shown in FIG. 1.

FIG. 13 is a block diagram of the structural regularity extraction component shown in FIG. 1. The structural regularity extraction component 1300 comprises inputs, processing modules and outputs. The inputs include a set of templates, a set of control signals, and a set of databus identifiers.

The set of templates is received from the functional regularity extraction component. A template is a representation of a subcircuit with at least two instances in the circuit. In one embodiment, the set of templates is received in the form of a net list. The set of control signals includes the signals used to control the operation of the circuit. The set of databus identifiers includes the names or other identifiers for the databuses in the circuit.

The processing modules comprise program modules that perform the functions for computer automated structural regularity extraction according to the present invention. Generally, program modules include routines, programs, objects, components, data structures, etc., that perform particular functions or implement particular abstract data types. The processing modules group the template instances generated by the functional regularity extraction component into vectors. A vector is a group of template instances that are identical in function and structure. In the context of the structural regularity extraction component, templates that are identical in structure have the following characteristics: a) the templates have the same number of input and output signals, and b) the templates have the same type of signals on all interfaces (the type of signal refers to whether the signal is a data signal or a control signal). Each vector forms a row in the circuit layout for the logic design. In other words, the vectors are used to form the rows in a physical layout for the logic design. One output of the structural regularity extraction component 1300 is a grouping of the template instances forming the set of vectors. A method of creating vectors according to one embodiment of the invention is shown in the flow chart of FIG. 14.

Figure 14:
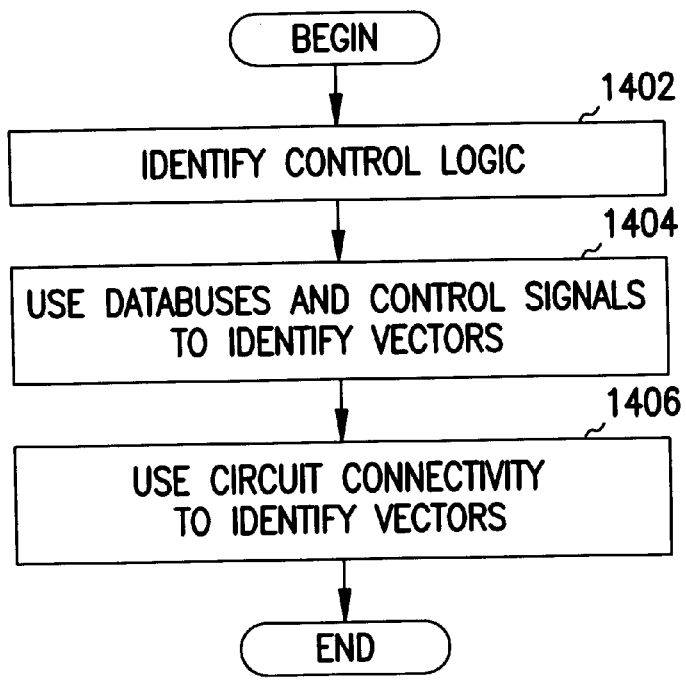
FIG. 14 is a high-level flow chart of a method of identifying vectors for a logic design according to one embodiment of the invention.

FIG. 14 is high-level flow chart of a method of generating vectors for a logic design according to one embodiment of the invention. The method begins by identifying control logic in the logic design (block 1402). In one embodiment, the control logic is excluded from the vectors. Instead, the control logic is treated separately. Control logic is identified using the set of control signals that is received by the structural regularity extraction component. The control logic is the logic that generates the control signals. For example, the control logic generates a clock signal for the sequential elements and a select signal for the multiplexers.

After the control logic is identified, the control signals and the databuses are used to generate vectors (block 1404). If two or more instances of a template share the same control signal or set of control signals and the instances of the template feed into the same databus, the template instances are grouped into a single vector. Thus, structural information (in this case, the control signals and the databus identifiers) is used to form the vectors. After all possible vectors are identified using the control signals and the databuses; the circuit connectivity is used to generate vectors from the remaining template instances (block 1406).

An example embodiment of the method of generating vectors shown in FIG. 14 is now described. FIGS. 15A, 15B, 15C, 15D, 15E, 15F, 15G, 15H, 15I and 15J are schematic diagrams of a logic design used to illustrate the method of generating vectors according to the example embodiment shown in FIG. 14.

Figure 15A:
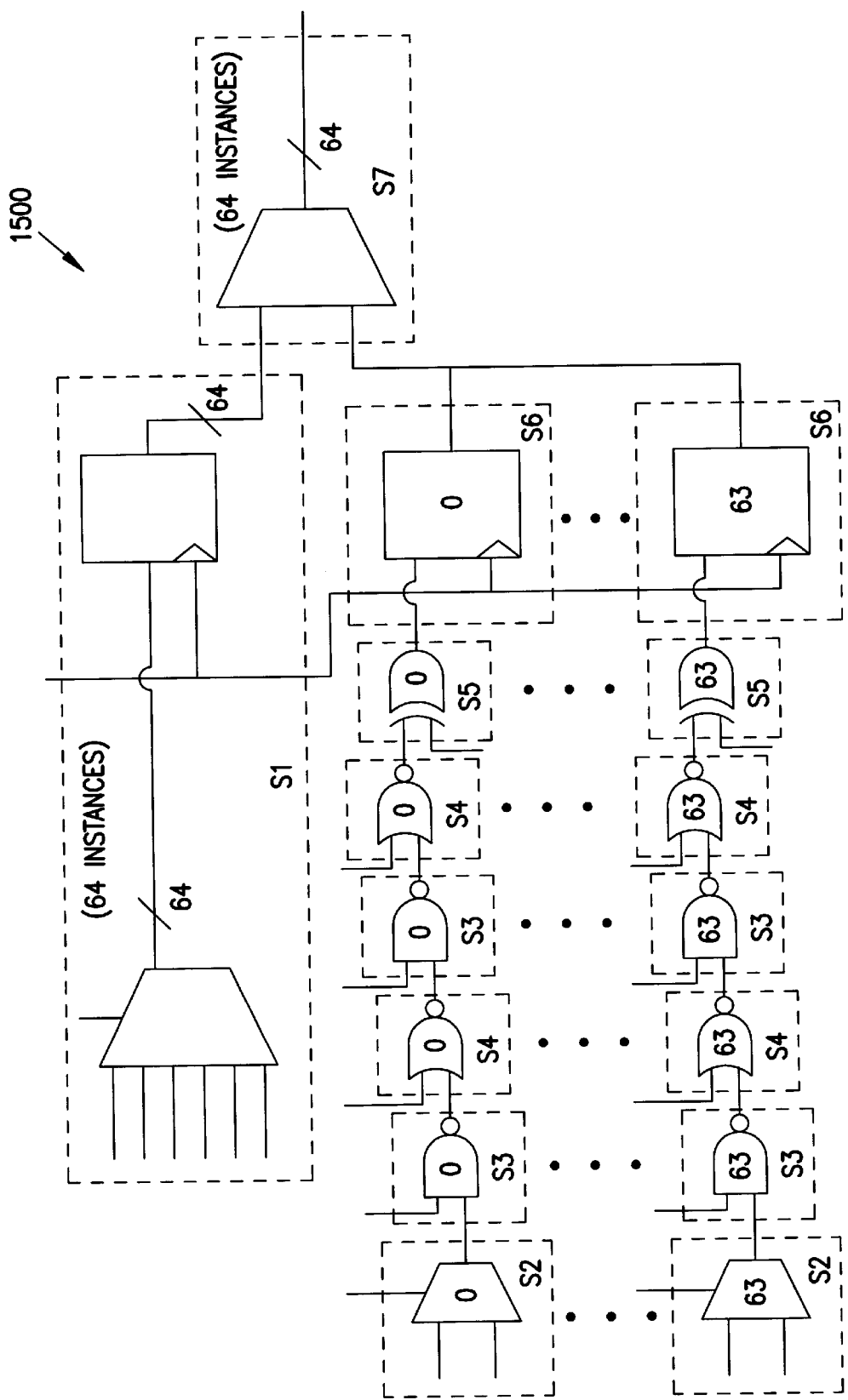
FIGS. 15A, 15B, 15C, 15D, 15E, 15F, 15G, 15H, 15I and 15J are schematic diagrams of a logic design used to illustrate a method of identifying vectors according to the embodiment shown in FIG. 14.

FIG. 15A is a schematic diagram of a logic design 1500 having templates identified according to one embodiment of the invention. Logic design 1500 shown in FIG. 15A is covered with multiple instances of seven different templates (S1, S2, S3, S4, S5, S6 and S7). Template S1 comprises a 6-to-1 multiplexer and a latch. The logic design 1500 comprises sixty-four instances of template S1. Template S2 comprises a 2-to-1 multiplexer. There are sixty-four instances of template S2 in the logic design 1500. Template S3 comprises a 2-input NAND gate. There are one hundred twenty-eight instances of template S3 in the logic design 1500. Template S4 comprises a 2-input NOR gate. There are one hundred twenty-eight instances of template S4 in the logic design 1500. Template S5 comprises an exclusive OR gate. There are sixty-four instances of template S5 in the logic design 1500. Template S6 comprises a latch. There are sixty-four instances of template S6 in logic design 1500. Template S7 comprises a 2-to-1 multiplexer. There are sixty-four instances of template S7 in the logic design 1500. The logic design 1500 is not limited to the templates shown in FIG. 15A. Alternate embodiments having additional or differing templates are contemplated. The templates shown in FIG. 15A are for illustrative purposes only.

In one embodiment of the present invention, the method of generating vectors begins by identifying control logic. The control logic is the logic that generates the control signals such as the select signals for the multiplexers and the clock signals for the latches. FIG. 15A does not show the control logic.

Figure 15B:
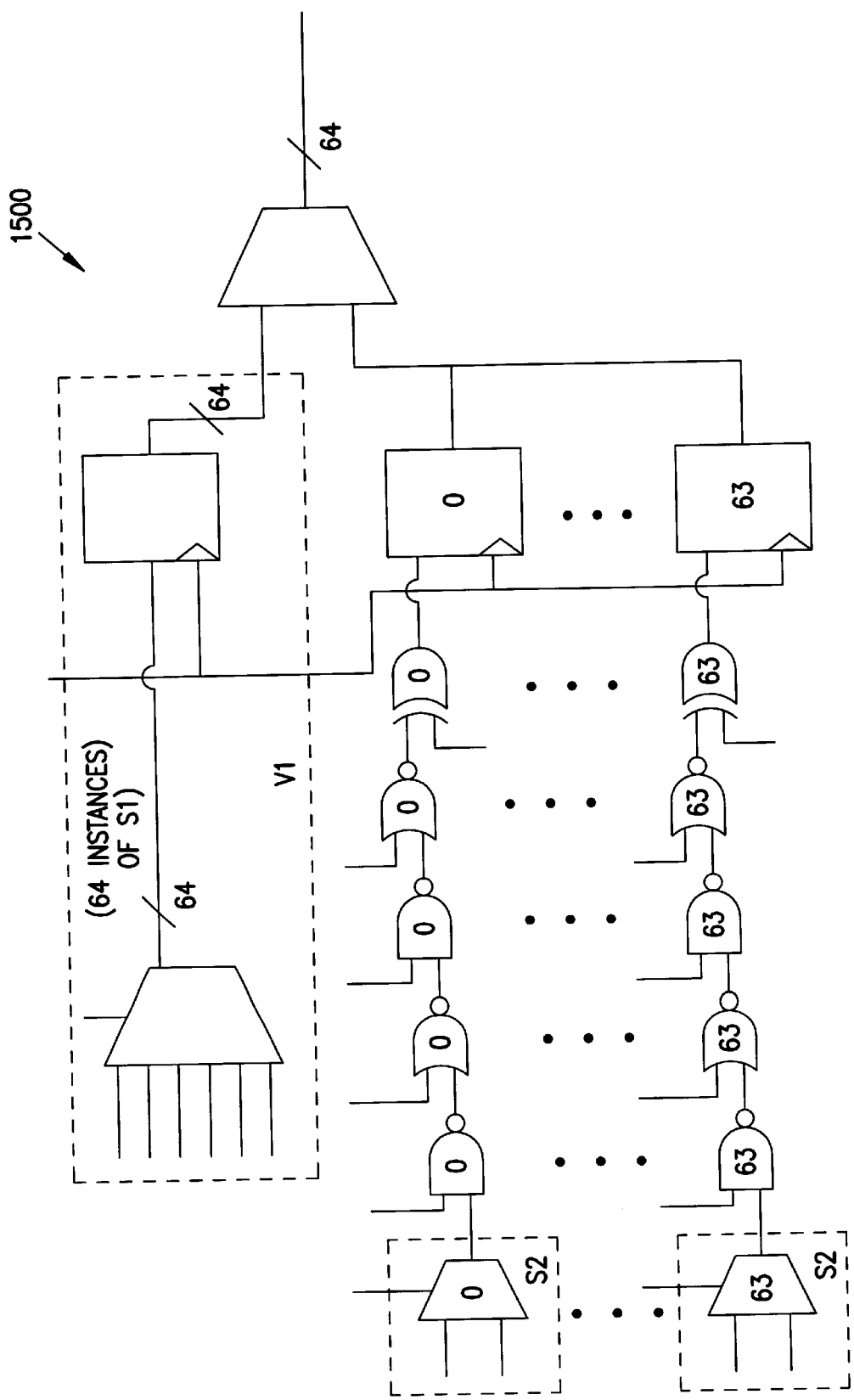

After identifying the control logic, the method of identifying vectors uses databus identifiers and control signals to identify vectors. For example, the sixty-four instances of template S1 share the same control signals. The control signals include the select signal for the 6-to-1 multiplexer and the clock signal for the latch. The sixty-four instances of template S1 also feed the same databus. Therefore, the sixty-four instances of template S1 are structurally similar and the sixty-four instances of template S1 are grouped together to form a single vector V1 as shown in FIG. 15B.

Figure 15C:
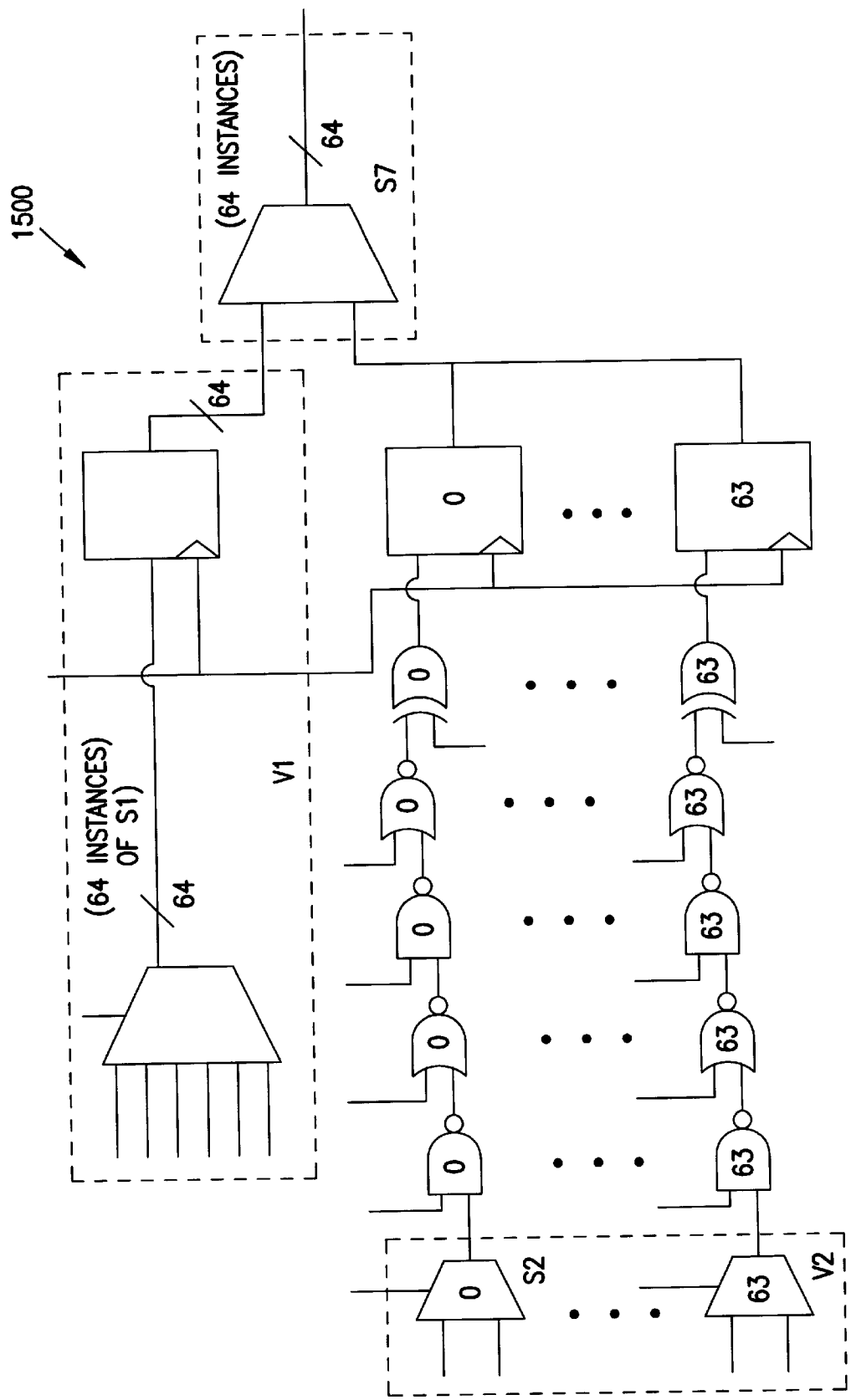
Figure 15D:
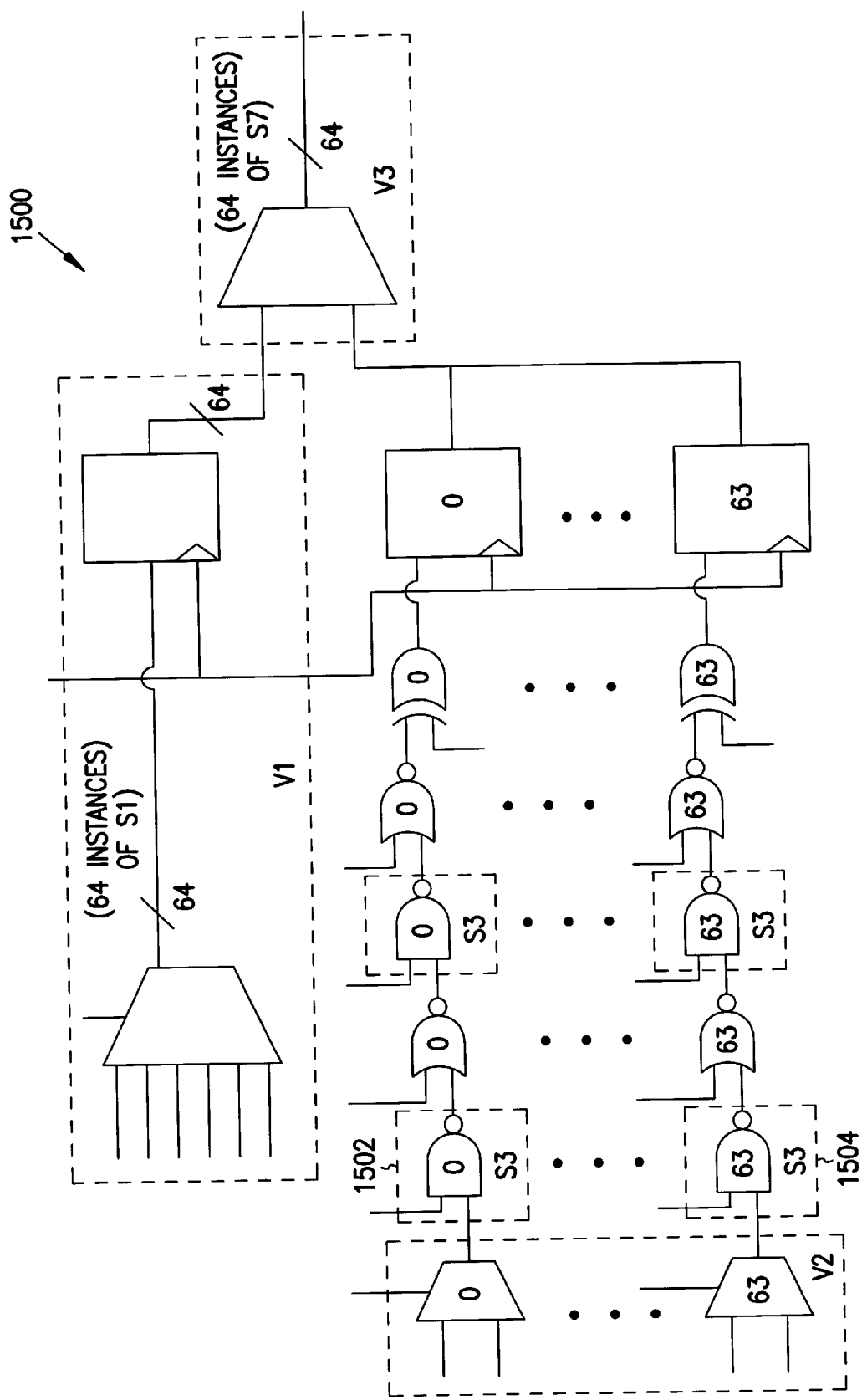

Template S2 comprises a 2-to-1 multiplexer which is driven by the same select signal in all sixty-four instances. The sixty-four instances of template S2 are grouped to form a single vector V2 as shown in FIG. 15C. Likewise, the sixty-four instances of template S7 comprises a 2-to-1 multiplexer which is driven by the same select signal in all instances. All instances of template S7 also drive the same databus. Therefore, the sixty-four instances of template S7 are grouped to form a single vector V3 as shown in FIG. 15D.

In this example embodiment, the instances of template S6 are not grouped to form a vector at this time even though the instances of template S6 have a common signal. If the second input to the latch (the non-clock input) of template S6 is from the same control bus, then the instances of template S6 would form a vector at this point. In this example embodimen, however, the instances of template S6 are grouped as a vector in the next step based on circuit connectivity which is described below.

After all possible vectors are identified using the control signal information and the databus information, the circuit connectivity is used to identify the remaining vectors. In the example shown in FIGS. 15A–15J, three vectors (V1, V2, and V3) were identified using the control signal data and the databus identifiers. However, in the example, control signal data and databus identifiers are not available for the remaining template instances (S3, S4, S5, and S6). In order to form vectors from the remaining template instances (S3, S4, S5 and S6), the circuit connectivity is used to identify vectors.

Figure 15E:
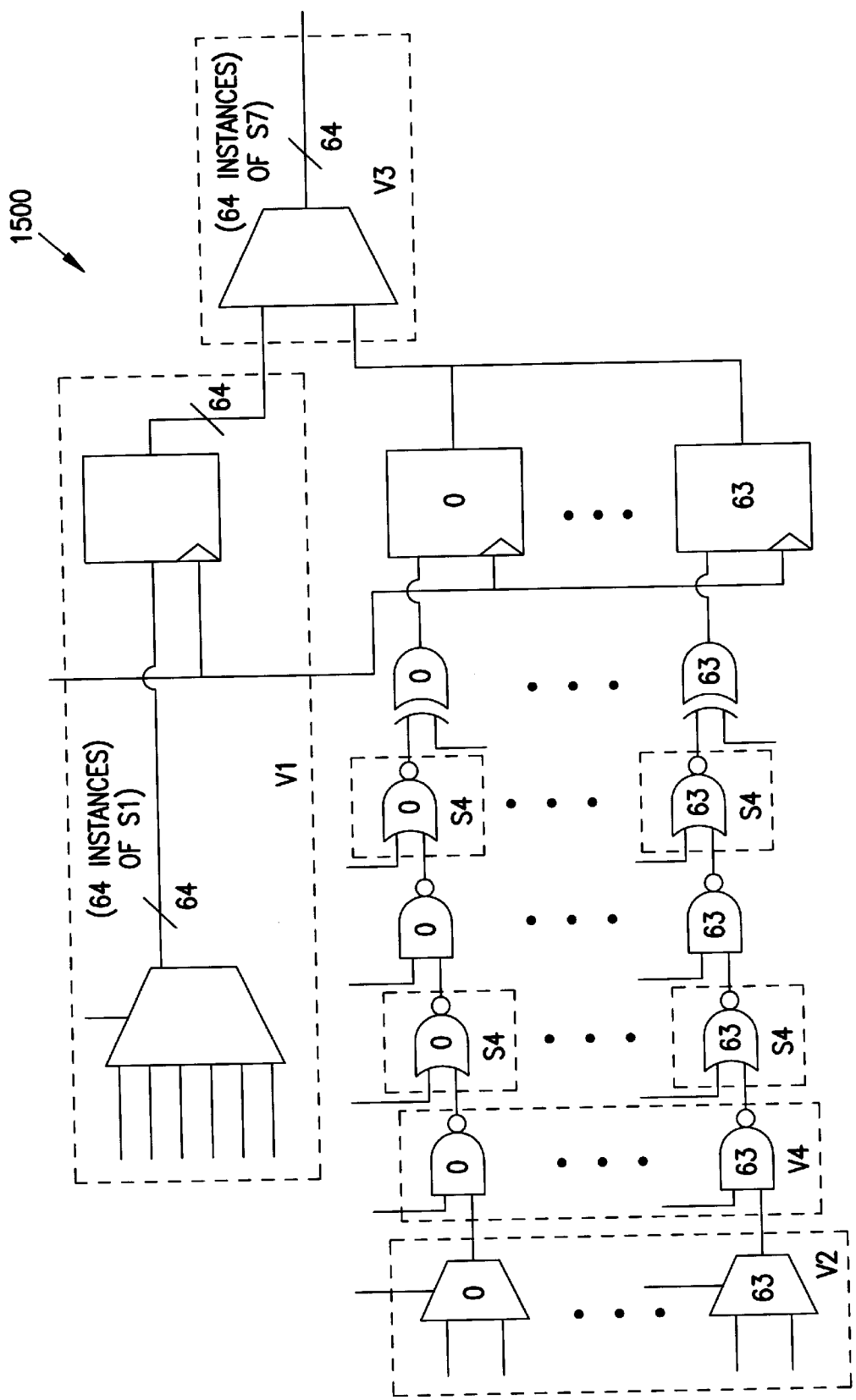

There are one hundred twenty-eight instances of template S3 (2-input NAND gate). However, all one hundred twenty-eight instances will not be grouped together in a single vector because the connections for the instances are structurally different. Of the one hundred twenty-eight instances of template S3, only sixty-four of the instances are connected to vector V2. As shown in FIG. 15D, vector V2 drives a first instance of template S3 (1502) and a second instance of template S3 (1504) and so on for sixty-four instances of template S3. The sixty-four instances of template S3 connected to vector V2 are grouped to form vector V4 as shown in FIG. 15E. Thus, by examining the previously formed vector V2 and the circuit connectivity, the vector V4 is identified. Vector V4 comprises sixty-four of the one hundred twenty-eight instances of template S3.

Figure 15F:
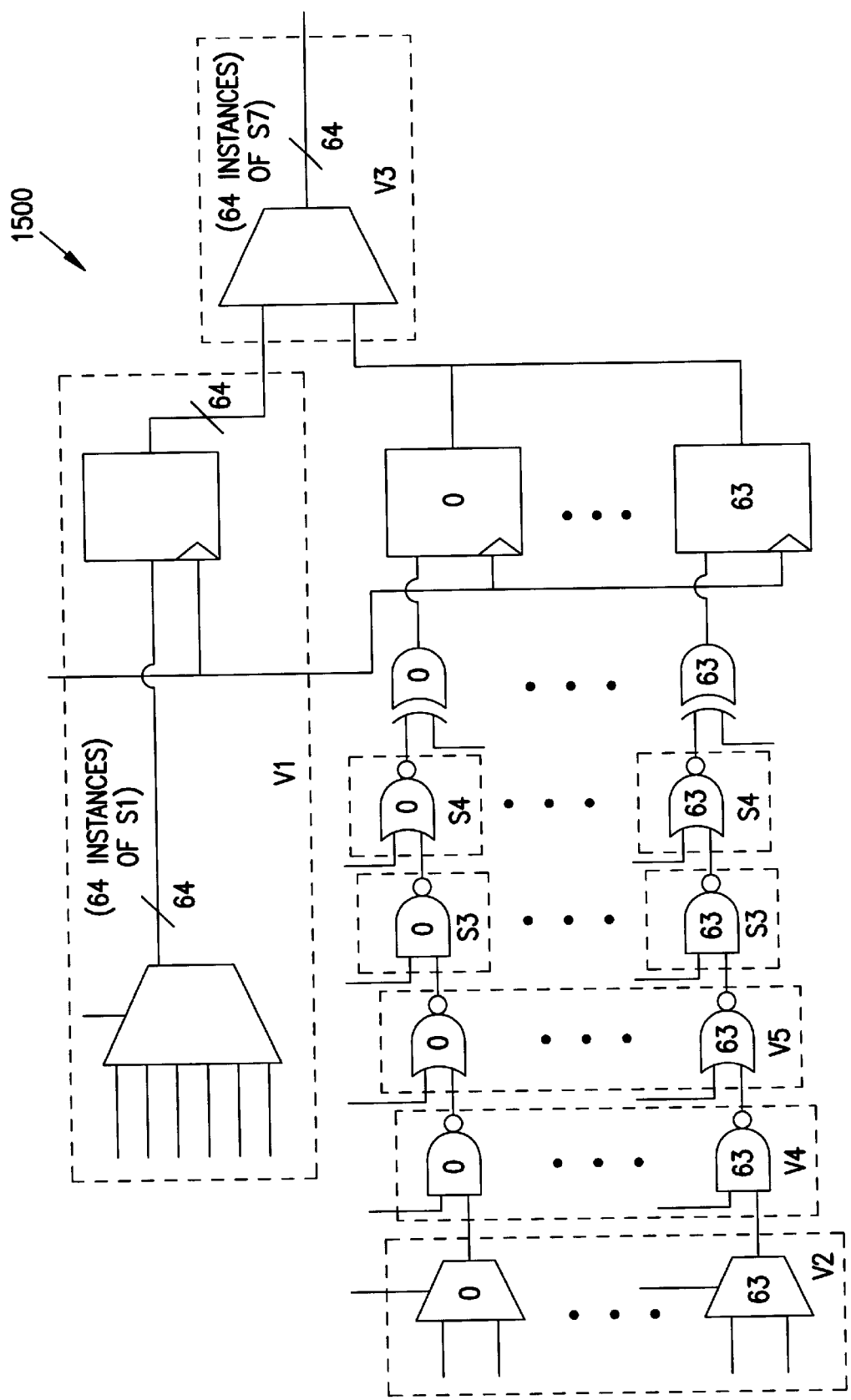

There are also one hundred twenty-eight instances of template S4 (2-input NOR gate). Of the one hundred twenty-eight instances of template S4, sixty-four of the instances are connected to vector V4. These sixty-four instances are grouped to form vector V5 as shown in FIG. 15F. The remaining sixty-four instances of template S4 are not grouped with vector V5 because the remaining instances of template S4 have different connections. Thus, by examining the previously formed vector V4 and the circuit connectivity, the vector V5 is generated. Vector V5 comprises sixty-four of the one hundred twenty-eight instances of template S4.

Figure 15G:
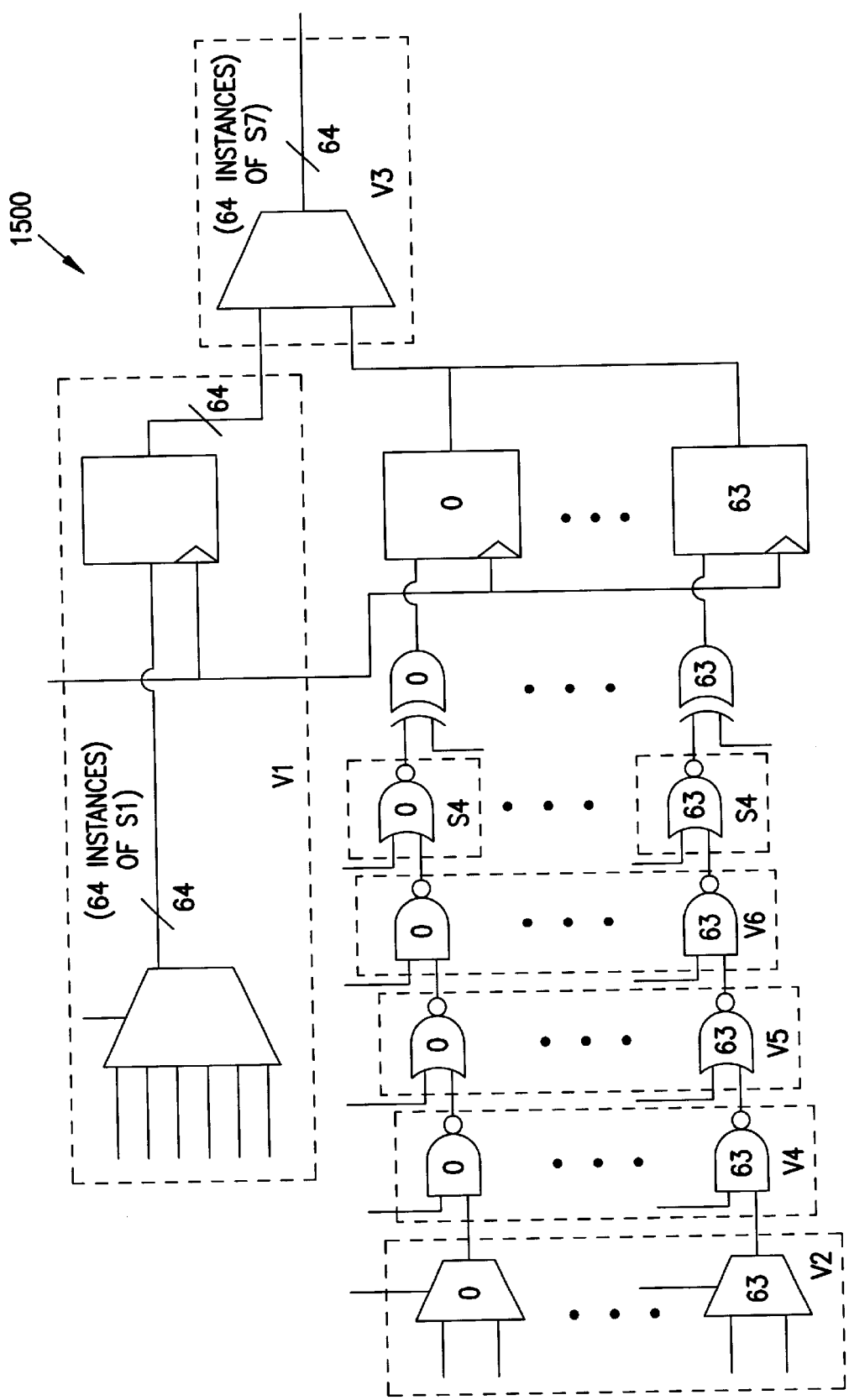
Figure 15H:
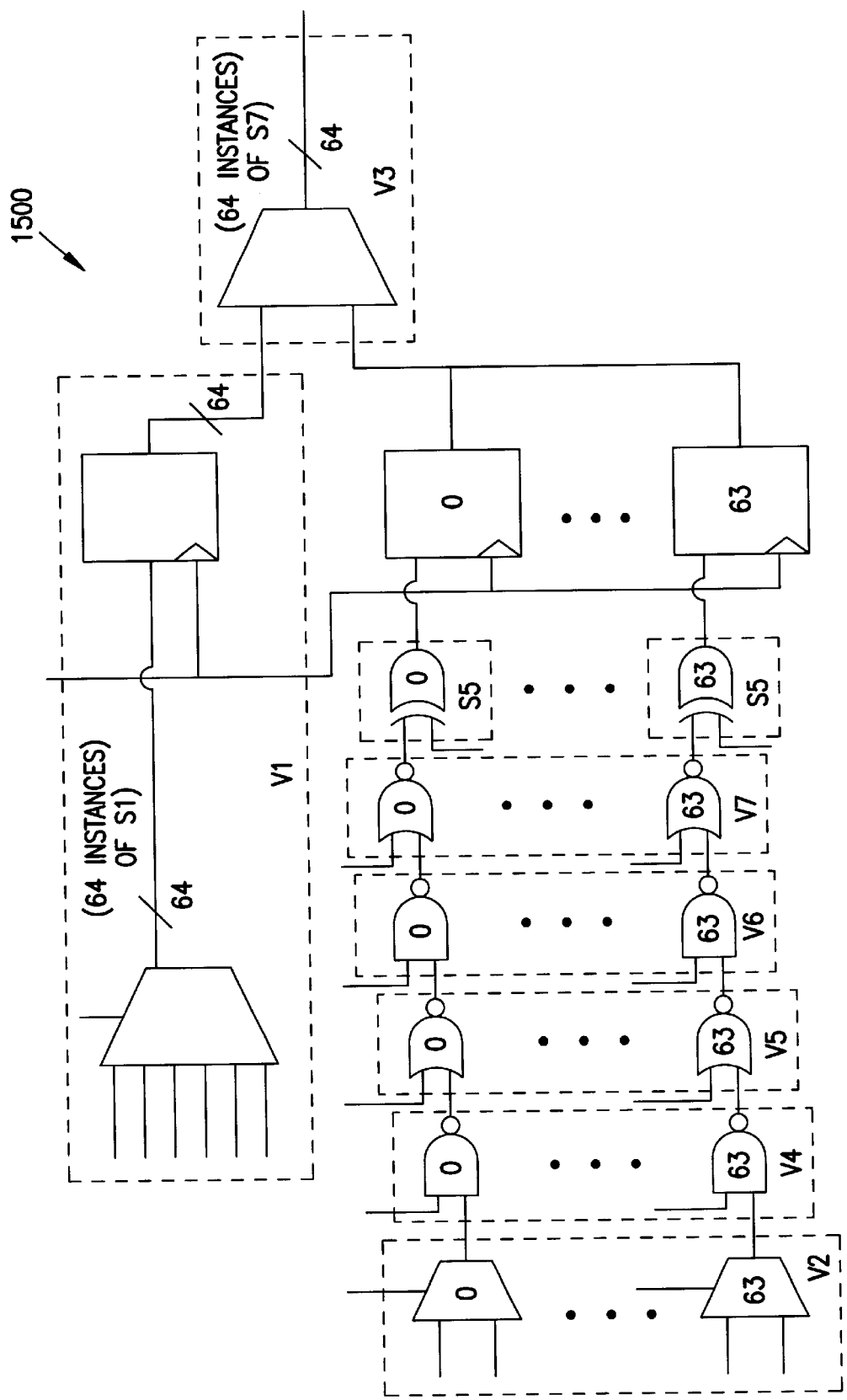

Vector V5 is connected to the remaining sixty-four instances of template S3 (2-input NAND gate). The remaining sixty-four instances of template S3 are grouped to form vector V6 as shown in FIG. 15G. Likewise, vector V6 is connected to the remaining sixty-four instances of template S4 (2-input NOR gate). The remaining sixty-four instances of template S4 are grouped to form vector V7 as shown in FIG. 15H.

Figure 15I:
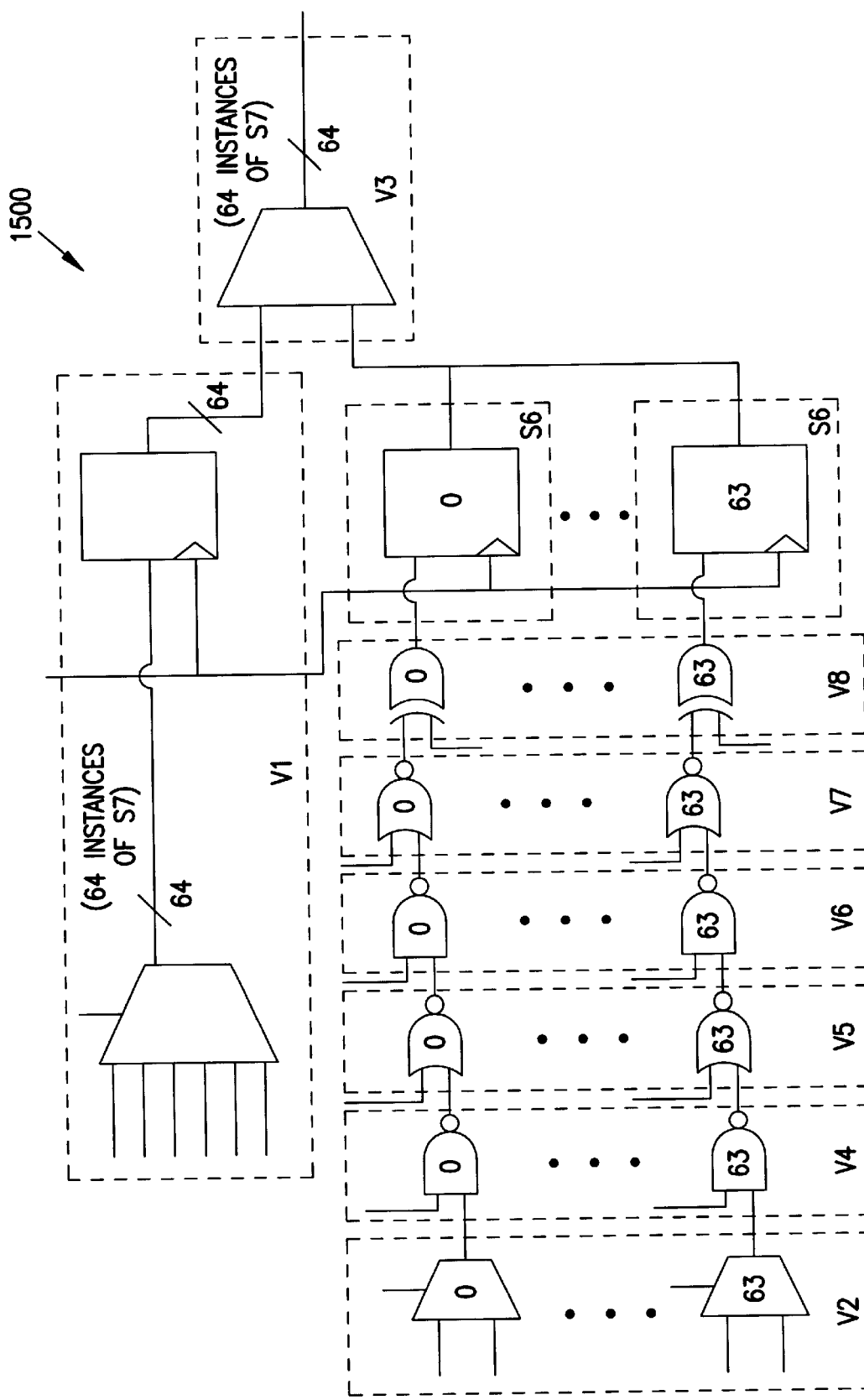

Vector V7 is connected to all sixty-four instances of template S5 (2-input exclusive OR gate). The sixty-four instances of template S5 are grouped to form vector V8 as shown in FIG. 15I. Finally, vector V8 is connected to all sixty-four instances of template S6 (a latch). The sixty-four instances of template S6 are grouped to form vector V9 as shown in FIG. 15J.

Figure 15J:
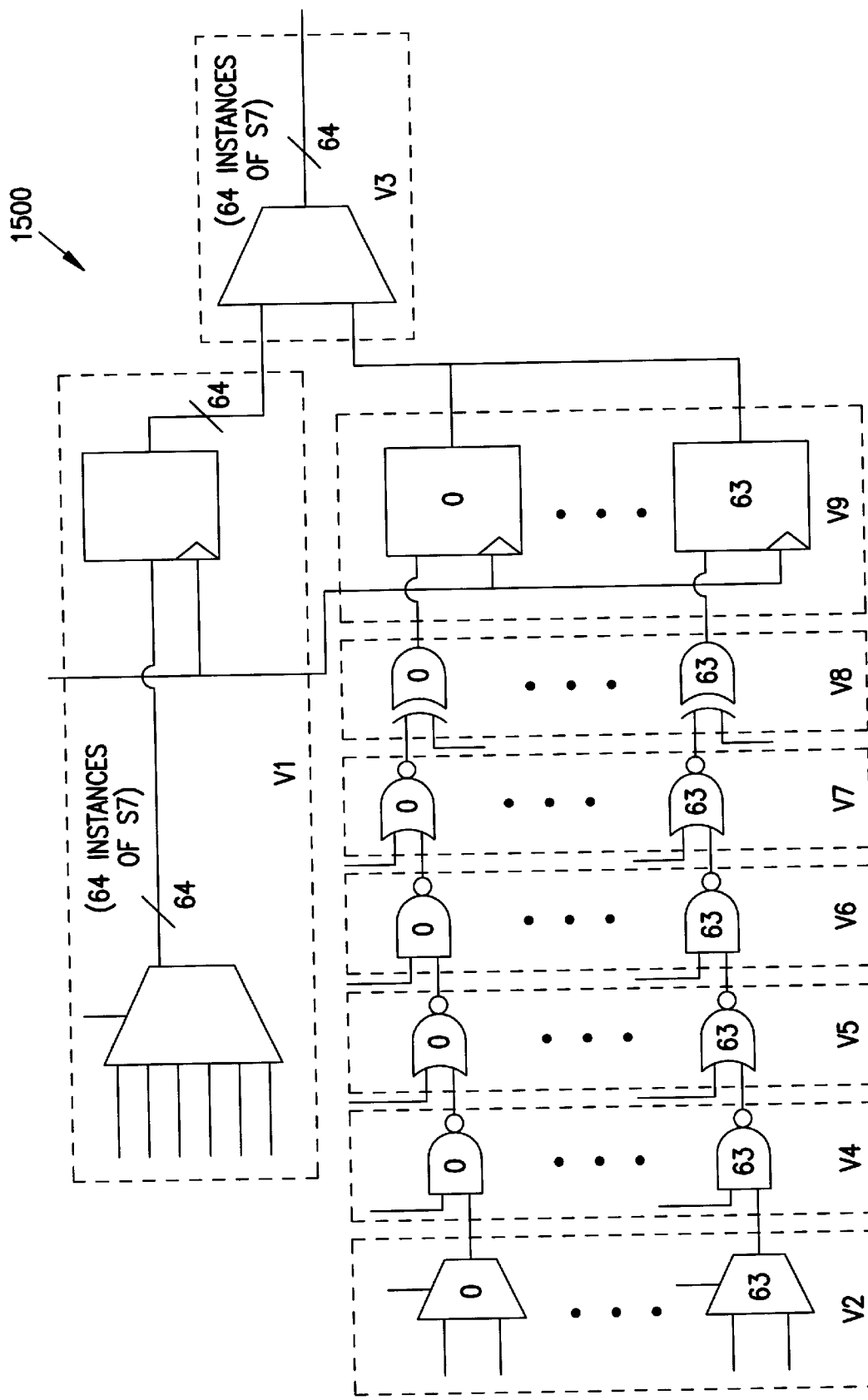

In the example embodiment of the invention described above, the five hundred seventy-six template instances shown in FIG. 15A are grouped into nine vectors as shown in FIG. 15J. Each of the nine vectors will form a row in the circuit layout. The placement of vectors in the circuit layout is discussed in more detail in section D.

D. Floorplanning

A structural regularity extraction component of a computer-aided design system according to one embodiment of the present invention has been described. This section further describes a floorplanning component as referred to in block 8 of FIG. 1.

Figure 16:
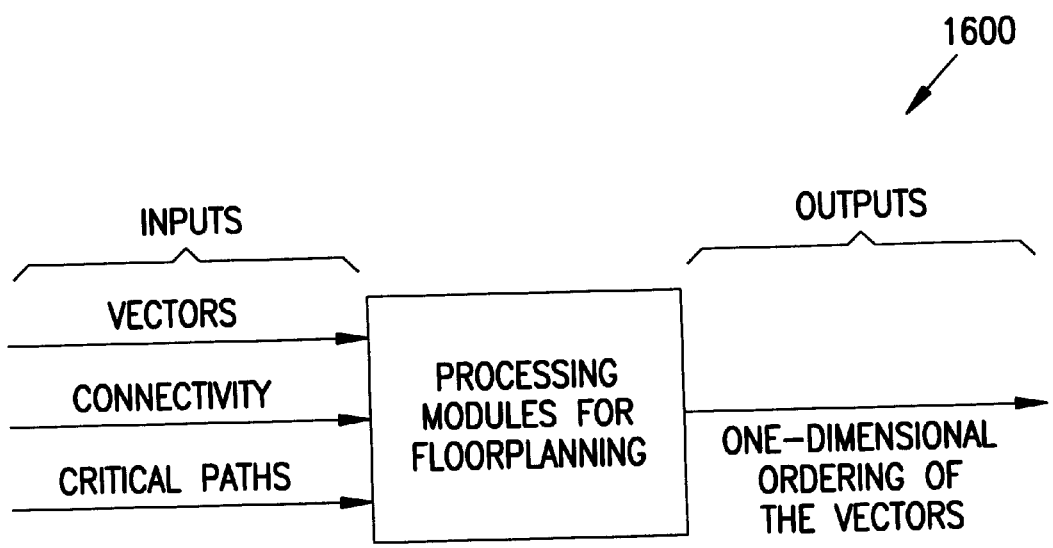
FIG. 16 is a block diagram of one embodiment of the floorplanning component shown in FIG. 1.

FIG. 16 is a block diagram of one embodiment of the floorplanning component shown in FIG. 1. The floorplanning component 1600 comprises inputs, processing modules and outputs. The inputs include a set of vectors and connectivity information for the vectors. In some embodiments, critical path information for the vectors is also received as an input.

The set of vectors is received from the structural regularity extraction component. For example, for the logic design shown in FIGS. 15A–15J, a set of nine vectors is received as an input to the floorplanning component. The connectivity information for the vectors identifies the interconnections between the vectors. The critical path information identifies a path through the circuit that is considered the most important path. In one embodiment, predefined timing goals are used to identify the most important path. The most important path is a path that does not meet the requirements of the predefined timing goals.

The processing modules comprise program modules that perform the functions for computer automated floorplanning according to the present invention. Generally, program modules include routines, programs, objects, components, data structures, etc., that perform particular functions or implement particular abstract data types. The processing modules identify a one-dimensional ordering of the vectors generated by the structural regularity extraction component. In one embodiment, each vector forms a row in the circuit layout for the logic design. In an alternate embodiment, a row in the circuit layout can also be formed from two or more small vectors. In one embodiment, the ordering of the vectors is selected to minimize the total wiring length. In an alternate embodiment, the ordering of the vectors is selected based on a critical path. One output of the floorplanning component 1600 is the one-dimensional ordering of the vectors for the circuit layout.

Figure 17:
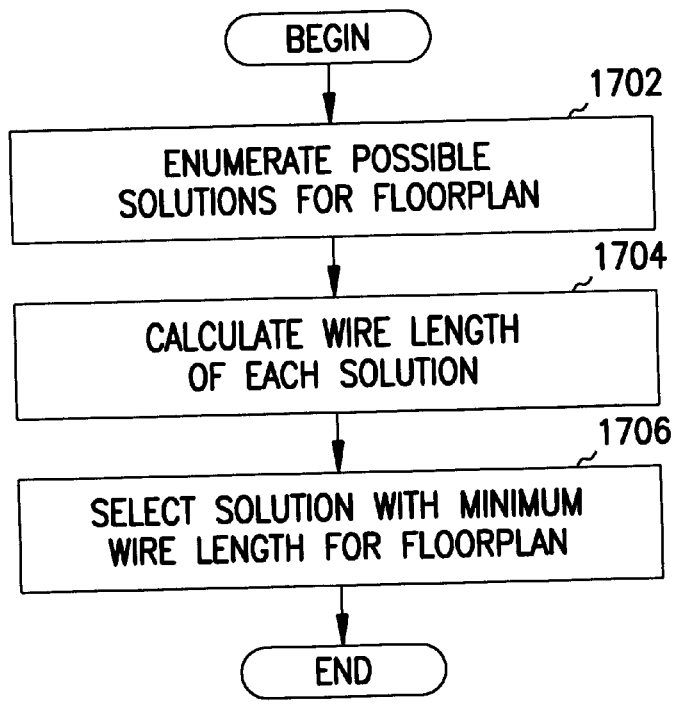
FIG. 17 is a high-level flow chart of a method of generating a floorplan using vectors according to one embodiment of the invention.

FIG. 17 is high-level flow chart of a method of generating a floorplan using vectors according to one embodiment of the invention. The method begins by enumerating the possible solutions for the floorplan (block 1702). In an embodiment in which the ordering of the vectors is selected to minimize the total wiring length in the layout, the wire length is calculated for each solution (block 1704). The solution with the minimum total wire length is selected for the floorplan (block 1706).

Figure 18:
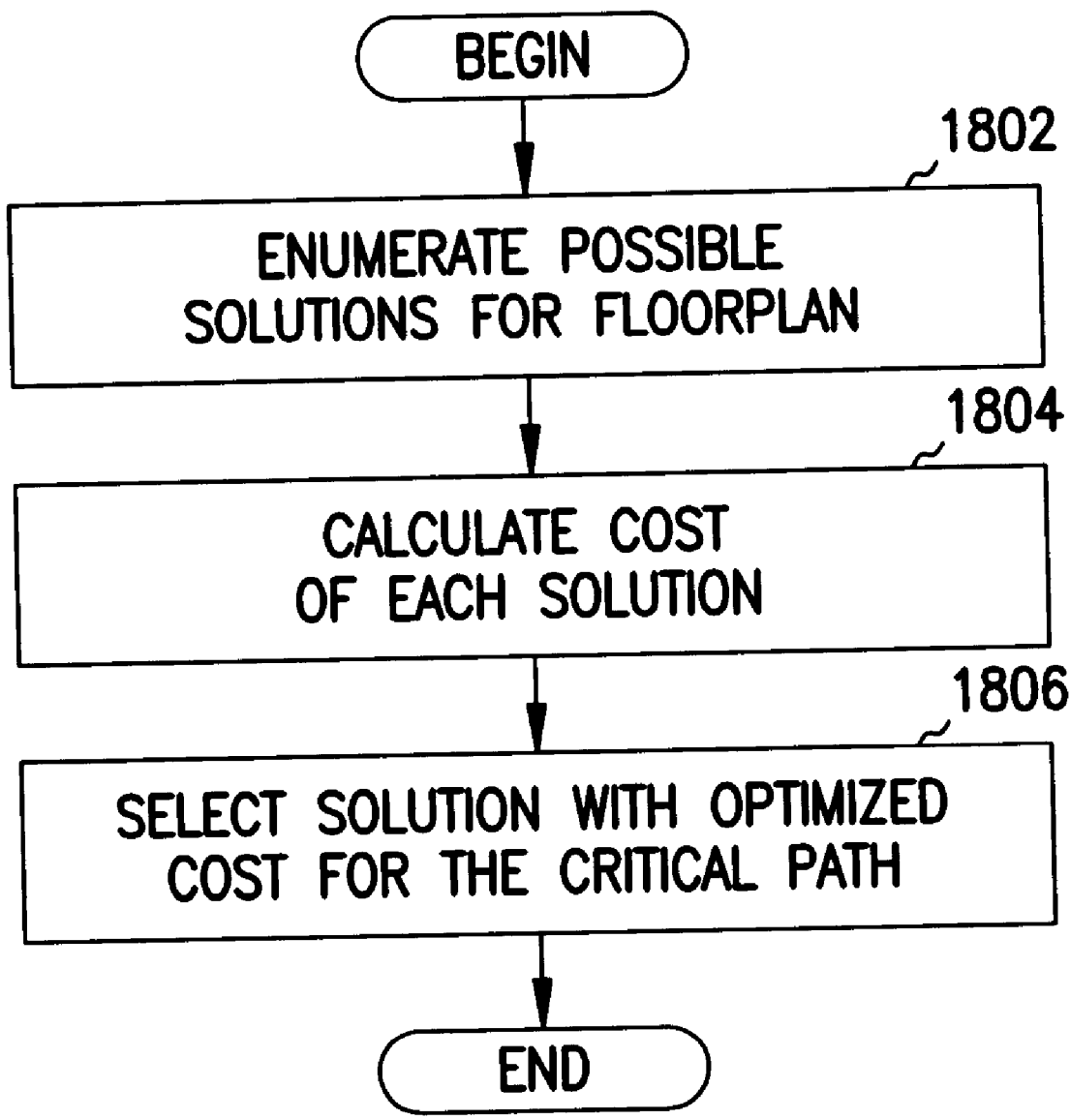
FIG. 18 is a high-level flow chart of a method of generating a floorplan using vectors according to an alternate embodiment of the invention.

FIG. 18 is high-level flow chart of a method of generating a floorplan using vectors according to an alternate embodiment of the invention. In the embodiment shown in FIG. 18, the ordering of the vectors is selected based on a critical path. The method begins by enumerating the possible solutions for the floorplan (block 1802). The cost of each solution is calculated (block 1804). In an example embodiment, calculating the performance of each solution is performed by assigning a weight to each wire. Wires in the critical path are assigned a greater weight than wires that are not in the critical path. A total weighted wiring length is calculated as the sum of each wire length multiplied by the weight of the wire. The solution with an optimized cost for the critical path is selected (block 1806). In alternate embodiments, the cost of each solution is calculated in terms of other resources such as area on the die, timing, power consumption, and the like.

Figure 19:
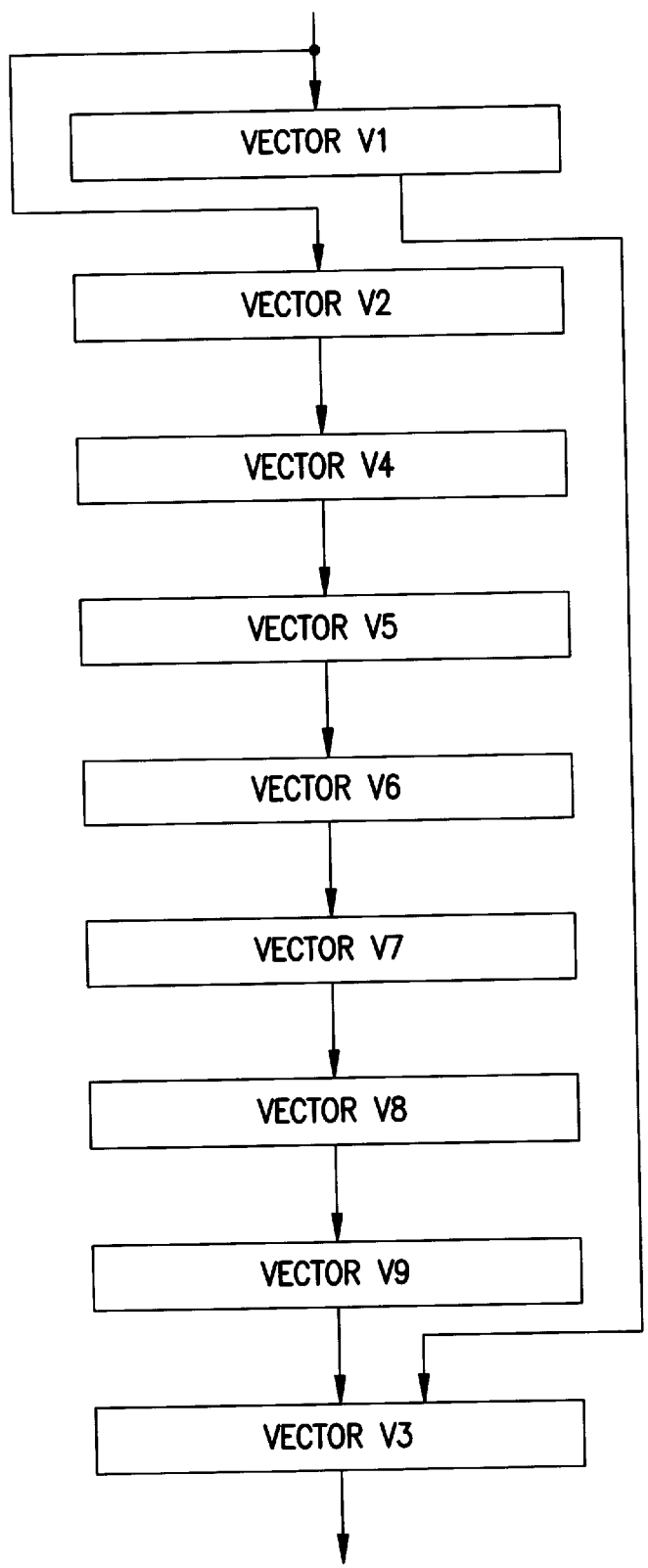
FIG. 19 is a floorplan for the vectors of the logic design shown in FIG. 15J according to one embodiment of the invention.

FIG. 19 is a floorplan for the vectors of the logic design shown in FIG. 15J according to one embodiment of the invention. Each of the nine vectors shown in FIG. 15J directly correspond to a row in the circuit layout shown in FIG. 19. For example, vector V1 forms one row in the circuit layout. Vector V2 forms another row in the circuit layout, and so on. For the example shown in FIG. 19, vector V1 and vector V2 are first level vectors which receive inputs from the same input bus. In FIG. 19, vector V1 is placed first in the layout followed by vector V2. Based on the circuit connectivity, the following vectors are placed in the following order after vector V2: vector V4, vector V5, vector V6, vector V7, vector V8 and vector V9. Vector V3 is placed after vector V9. As shown in FIG. 19, vector V3 receives inputs from both vector V9 and vector V1.

Figure 20:
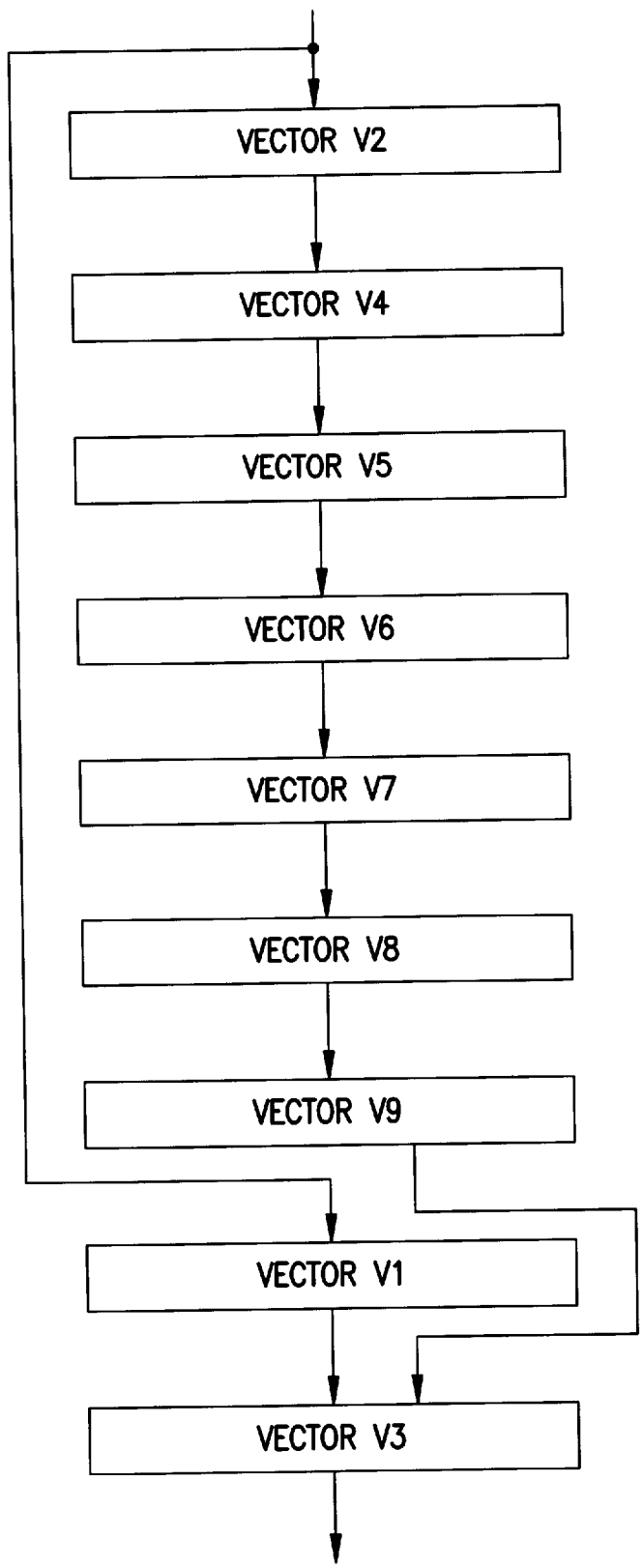
FIG. 20 is an alternate floorplan for the vectors of the logic design shown in FIG. 15J.

The floorplan for the vectors of the logic design shown in FIG. 15J is not limited to the floorplan shown in FIG. 19. FIG. 20 is an alternate floorplan for the vectors of the logic design shown in FIG. 15J. As shown in FIG. 20, the first level vector V2 is placed first in the layout. Based on the circuit connectivity, the following vectors are placed in the following order after vector V2: vector V4, vector V5, vector V6, vector V7, vector V8 and vector V9. Vector V1 is placed after vector V9. Vector V3 which receives inputs from both vector V9 and vector V1 is placed after vector V1.

The invention is not limited to the placement of the vectors as shown in FIGS. 19 and 20. The floorplans shown in FIGS. 19 and 20 are for illustrative purposes only. Alternate embodiments having the vectors placed in a different order are contemplated as within the scope of the invention. For example, the placement of the vectors may be optimized for area or to reduce the total wire length as shown in FIGS. 17 and 18.

The floorplanning component of embodiments of the present invention uses computer-automated operations to place the vectors in a one-dimensional ordering for a circuit layout. Previous floorplanning methods placed circuit components almost entirely by hand in a two-dimensional manner. The computer automated floorplanning method of the present invention improves the productivity of circuit designers.

E. Computer Hardware and Operating Environment

Figure 21:
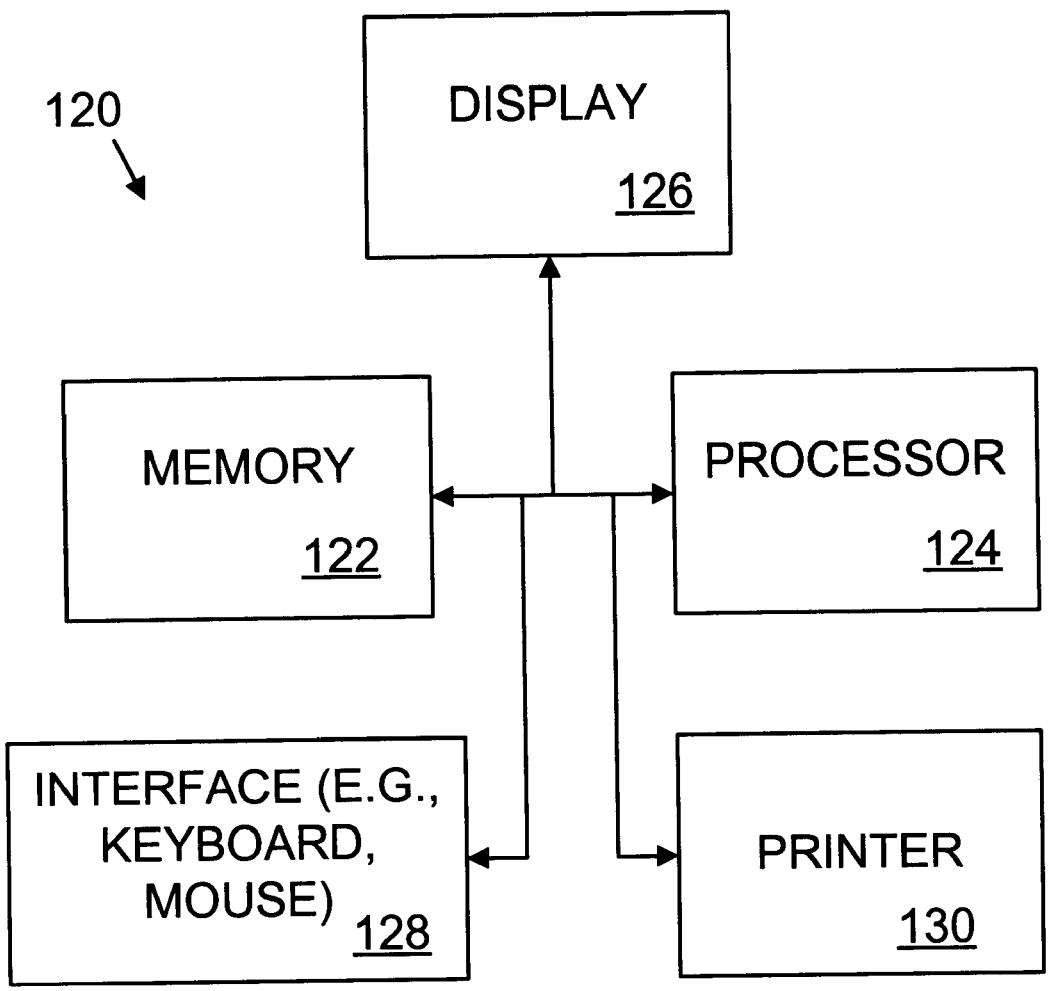
FIG. 21 illustrates a computer system that can be used in regularity extraction.

This section provides an overview of the hardware and the operating environment in conjunction with which embodiments of the invention can be practiced. FIG. 21 is a diagram of a computerized system in conjunction with which embodiments of the invention may be implemented.

Referring to FIG. 21, a computer system 120 includes memory 122, processor 124, display 126, interface 128, and printer 130. In some embodiments, processor 124 executes a program from memory 122 that performs functional regularity extraction, structural regularity extraction and floorplanning as described herein. Memory 122 may hold the descriptor language from which regularity is to be extracted, etc. The floorplan for vectors can be presented, for example, visually on display 126 or printed through printer 130. The user can select options through interface 128 (e.g., a keyboard or mouse). Memory 122 is intended as a generalized representation of memory and may include a variety of forms of memory, such as a hard drive, CD-ROM, and random access memory (RAM) and related circuitry. A hard drive, CD-ROM, and RAM are examples of articles including machine readable media. For example, the computer-aided design program performing the functional regularity extraction, structural regularity extraction or floorplanning may be included on a CD-ROM and loaded from the CD-ROM to a hard drive. The high level description may be received, for example, on a disk or remotely through, for example, a modem. The hardware and operating environment in conjunction with which embodiments of the invention can be practiced has been described.

Those skilled in the art having the benefit of this disclosure will appreciate that many other variations from the foregoing description and drawings may be made within the scope of the present invention. Accordingly, it is the following claims including any amendments thereto that define the scope of the invention.

What is claimed is:

1. A computerized method for identifying structural regularity in a logic design, the method comprising:

receiving a plurality of templates covering the logic design;

receiving one or more control signals for the logic design;

receiving one or more databus identifiers for the logic design; and generating a first vector for the logic design through computer automated operations to combine at least one instance of one of the plurality of templates based on the control signals, the databus identifiers and connectivity of the logic design.

2. The computerized method of claim 1 wherein the first vector comprises each one of the instances of a first one of the templates having a same set of the control signals and feeding a same databus.

3. The computerized method of claim 2 wherein a second vector is generated from each one of the instances of a second one of the templates having a same set of connections in the logic design.

4. The computerized method of claim 1 wherein the plurality of templates is received in a net list.

5. The computerized method of claim 1 wherein at least one of the plurality of templates is a tree template.

6. The computerized method of claim 1 wherein at least one of the plurality of templates is a multi-output template.

7. The computerized method of claim 1 wherein at least one of the plurality of templates is a single-principal output template.

8. An article comprising:

a machine-readable media including instructions that when executed cause a computer to:

receive a plurality of templates covering the logic design;

receive one or more control signals for the logic design;

receive one or more databus identifiers for the logic design; and generate a first vector for the logic design through computer automated operations to combine at least one of the plurality of templates based on the control signals, the databus identifiers and connectivity of the logic design.

9. The article of claim 8 wherein the first vector comprises each one of the instances of a first one of the templates having a same set of control signals and feeding a same databus.

10. The article of claim 9, wherein a second vector is generated from each one of the instances of a second one of the templates having a same set of connections in the logic design.

* * * * *